(12) United States Patent  
Zhang et al.

(10) Patent No.: US 8,914,262 B2  
(45) Date of Patent: Dec. 16, 2014

(54) VISUALIZATION OF DATA DEPENDENCY IN GRAPHICAL MODELS

(75) Inventors: Fu Zhang, Sherborn, MA (US); Zhi Han, Acton, MA (US); Murali Yeddanapudi, Watertown, MA (US); Pieter Johannes Mosterman, Framingham, MA (US)

(73) Assignee: The MathWorks, Inc., Natick, MA (US)

( * ) Notice: Subject to any disclaimer, the term of this patent is extended or adjusted under 35 U.S.C. 154(b) by 261 days.

(21) Appl. No.: 13/291,899

(22) Filed: Nov. 8, 2011

(65) Prior Publication Data

US 2013/0116986 A1    May 9, 2013

(51) Int. Cl.
 *G06F 17/50* (2006.01)
 *G06F 9/44* (2006.01)

(52) U.S. Cl.
 CPC .............. *G06F 8/10* (2013.01); *G06F 17/5009* (2013.01)
 USPC ................. 703/2; 703/13; 717/105; 717/168; 714/732

(58) Field of Classification Search
 USPC .................. 703/2, 13; 717/105, 168; 714/732
 See application file for complete search history.

(56) References Cited

U.S. PATENT DOCUMENTS

| | | | | |
|---|---|---|---|---|
| 6,226,789 | B1 * | 5/2001 | Tye et al. | 717/138 |
| 7,904,280 | B2 | 3/2011 | Wood | |
| 8,156,147 | B1 * | 4/2012 | Tocci et al. | 707/790 |
| 2007/0043992 | A1 * | 2/2007 | Stevenson et al. | 714/732 |
| 2007/0083347 | A1 | 4/2007 | Bollobas et al. | |
| 2007/0157162 | A1 | 7/2007 | Ciolfi | |
| 2008/0059739 | A1 | 3/2008 | Ciolfi et al. | |
| 2009/0012754 | A1 | 1/2009 | Mosterman et al. | |
| 2009/0228250 | A1 | 9/2009 | Phillips | |
| 2009/0235252 | A1 | 9/2009 | Weber et al. | |
| 2010/0017179 | A1 | 1/2010 | Wasynczuk et al. | |
| 2010/0057651 | A1 | 3/2010 | Fung et al. | |
| 2010/0228693 | A1 | 9/2010 | Dawson et al. | |
| 2010/0262568 | A1 | 10/2010 | Schwaighofer et al. | |
| 2011/0137632 | A1 | 6/2011 | Paxson et al. | |
| 2012/0023477 | A1 * | 1/2012 | Stevenson et al. | 717/105 |
| 2013/0116987 | A1 | 5/2013 | Zhang et al. | |
| 2013/0116988 | A1 | 5/2013 | Zhang et al. | |
| 2013/0116989 | A1 | 5/2013 | Zhang et al. | |
| 2013/0198713 | A1 | 8/2013 | Zhang et al. | |

OTHER PUBLICATIONS

Hiskens, Ian A. and Pai, M.A. "Trajectory Sensitivity Analysis of Hybrid Systems." IEEE Transactions on Circuits and Systems—Part I: Fundamental Theory and Applications, vol. 47, No. 2, Feb. 2000, pp. 204-220.

(Continued)

*Primary Examiner* — Thai Phan
(74) *Attorney, Agent, or Firm* — Harrity & Harrity, LLP

(57) ABSTRACT

In an illustrative embodiment, an apparatus, computer-readable media, or method may be configured to suggest determine relationships. Interaction with a block diagram model may include receiving a first portion of a block diagram model. The block diagram model may include a plurality of blocks. Each of the plurality of blocks may represent a set of dynamic equations. The interacting may be performed using the computer. Relationships between a plurality of a synthesized input, a synthesized output, a synthesized state, or a synthesized derivative, may be determined. A determination may be performed for the first portion of the block diagram model. The determining may include determining a block Jacobian pattern of relationships between two or more of an input, an output, a state, or a derivative of a first block of the plurality of blocks in the graphical model.

38 Claims, 19 Drawing Sheets

(56) References Cited

OTHER PUBLICATIONS

Hiskens, Ian A. and Pai, M.A. "Power System Applications of Trajectory Sensitivities." IEEE, 2002, pp. 1-6.
Nguyen, Tony B., Pai, M.A, and Hiskens, I.A. "Computation of Critical Values of Parameters in Power Systems Using Trajectory Sensitivities." 14th PSCC, Sevilla, Jun. 24, 2002, Session 39, Paper 5, pp. 1-6.
Donze, Alexandre and Maler, Oded. "Systematic Simulation using Sensitivity Analysis." Verimag, Gieres, France, pp. 1-16.
Masse, J. "Diffedge: Differentiation, sensitivity analysis and idenfication of hybrid Models." Appedge, Consulting & Engineering, pp. 1-9.
Serban, Radu and Hindmarsh, Alan C. "CVODES: An ODE Solver with Sensitivity Analysis Capabilities." ACM Transactions on Mathematical Software, vol. V, No. N, Sep. 2003, pp. 1-22.
Griewank, Andreas. "A mathematical view of automatic differentiation." Acta Numerica, 2003, pp. 1-78.
Griewank, Andreas and Reese, Shawn. "On the Calculation of Jacobian Matrices by the Markowitz Rule." Mar. 1992, pp. 1-14.
Henzinger, Thomas A. "The Theory of Hybrid Automata." pp. 1-30.
Zecevic, A.I. And Siljak, D.D. "Design of Robust Static Output Feedback for Large-Scale Systems." IEEE Transactions on Automatic Control, vol. 49, No. 11, Nov. 2004, pp. 1-5.
Peponides, George M. and Kokotovic, Petar V. "Weak Connections, Time Scales, and Aggregation of Nonlinear Systems." IEEE Transactions on Automatic Control, vol. AC-28, No. 6, Jun. 1983, pp. 729-735.
Siljak, D.D. "On Stability of Large-Scale Systems under Structural Perturbations." IEEE Transactions on Systems, Man, and Cybernetics, Jul. 1973, pp. 415-417.
Vidyasagar, M. "Decomposition Techniques for Large-Scale Systems with Nonadditive Interactions: Stability and Stabilizability." IEEE Transactions on Automatic Control, vol. AC-25, No. 4, Aug. 1980, pp. 773-779.
International Search Report and Written Opinion dated Jan. 31, 2013 issued in corresponding PCT application No. PCT/I/US2012/063223, 9 pages.
Co-pending U.S. Appl. No. 13/291,907, entitled "Graphic Theoretic Linearization of Sensitivity Analysis", by Zhang et al., filed Nov. 8, 2011, 64 pages.
Bang Jensen et al., "Digraphs Theory, Algorithms and Applications", Aug. 2007, 772 pages.
Bauer, "Computational Graphs and Rounding Error", Siam Journal on Numerical Analysis, vol. 11 No. 1, Mar. 1974, 10 pages.
Griewank, et al., "Evaluating Derivatives: Principles and Techniques of Algorithmic Differentiation", 2008, 458 pages.
Sezer et al., "Nested Epsilon Decompositions of Linear Systems: Weakly Coupled and Overlapping Blocks", Proceedings of the 1990 Bilkent Conference on New Trends in Communication, Control and Signal Processing, vol. 1, (1990), 13 pages.
Zecevic et al., "Control of Complex Systems—Decompositions of Large-Scale Systems", Chapter 1, Communications and Control Engineering, (2010) 27 pages.
Henzinger, "The Theory of Hybrid Automata", Proceedings of the $11^{th}$ Symposium on Logic in Computer Science (LICS '96) 1996, 30 pages.
Paliwal et al., "State Space Modeling of a Series Compensated Long Distance Transmission System through Graph Theoretic Approach", IEEE, 1978, 10 pages.
Ilic et al., "A Simple Structural Approach to Modeling and Analysis of the Inter-area Dynamics of the Large Electric Power Systems: Part I—Linearized Models of Frequency Dynamics", 1993 North American Power Symposium, Oct. 11-12, 1993, pp. 560-569.
Ilic et al., "A Simple Structural Approach to Modeling and Analysis of the Inter-area Dynamics of the Large Electric Power Systems: Part II—Nonlinear Models of Frequency and Voltage Dynamics", Oct. 11-12, 1993, pp. 570-578.
Zhou et al., "Essentials of Robust Control", Prentice-Hall, Inc., 1998, 411 pages.
Jamshidi et al., "Applications of Fuzzy Logic Towards High Machine Intelligence Quotient Systems", Environmental and Intelligent Manufacturing Systems Series, Prentice Hall PTR, 1997, 423 pages.
Štiljak, "Large-Scale Dynamic Systems—Stability and Structure", Dover Publications, Inc., 1978, 416 pages.
Frank, "Introduction to System Sensitivity Theory", Academic Press, Inc., 1978, 386 pages.
Štiljak, "Decentralized Control of Complex Systems", Dover Publications, Inc., 1991, 528 pages.
Ilić et al., "Dynamics and Control of Large Electric Power Systems", John Wiley & Sons, Inc., 2000, 838 pages.
Webster, "Wiley Encyclopedia of Electrical and Electronics Engineering—vol. 11", John Wiley & Sons, Inc., 1999, 763 pages.

\* cited by examiner

VISUALIZATION OF DATA DEPENDENCY IN GRAPHICAL MODELS

This patent application is related to the co-filed application entitled "GRAPH THEORETIC LINEARIZATION AND SENSITIVITY ANALYSIS," which is hereby incorporated by reference in its entirety.

BACKGROUND SECTION

A variety of dynamic systems exist, including systems for communications, controls, signal processing, video processing, and image processing. As systems have become more complicated, the development and testing of these systems have also become more complicated. Accordingly, computational tools have been developed to help model, simulate, and analyze systems.

In one approach to modeling, simulating and analyzing systems, computational tools may represent systems as graphical models. Systems may be graphically modeled by decomposing components of the system into individual blocks. These blocks may then be connected to one another to form a block diagram model representing a system.

BRIEF DESCRIPTION OF THE DRAWINGS

The accompanying drawings, which are incorporated in and constitute a part of this specification, illustrate one or more embodiments of the invention and, together with the description, explain one or more illustrative embodiments of the invention. In the drawings.

DETAILED DESCRIPTION

Overview

Computational tools may help users model, simulate, and/or analyze dynamic systems by representing the systems as graphical models. Graphical models may be block diagram models composed of connected individual blocks. Graphical model based computational tools may be provided for a technical computing environment and may allow a user to modify a system. For example, a user may change blocks or connections in the block diagram model.

However, in block diagram models with many blocks and/or many connections, it may be difficult for a user to determine how a block diagram model should be modified. For example, a user may determine that the output value of a block must be increased; however, the user may need to know what portions of the block diagram model the output value of the block is dependent on so that the user may modify the output value. Otherwise, it may be difficult for the user to obtain the desired effect when the model is simulated. Exemplary embodiments can provide computational tools that determine what portions of the block diagram model an output is dependent on. Embodiments may further visually indicate these dependencies to the user.

Illustrative System

Figure 1:
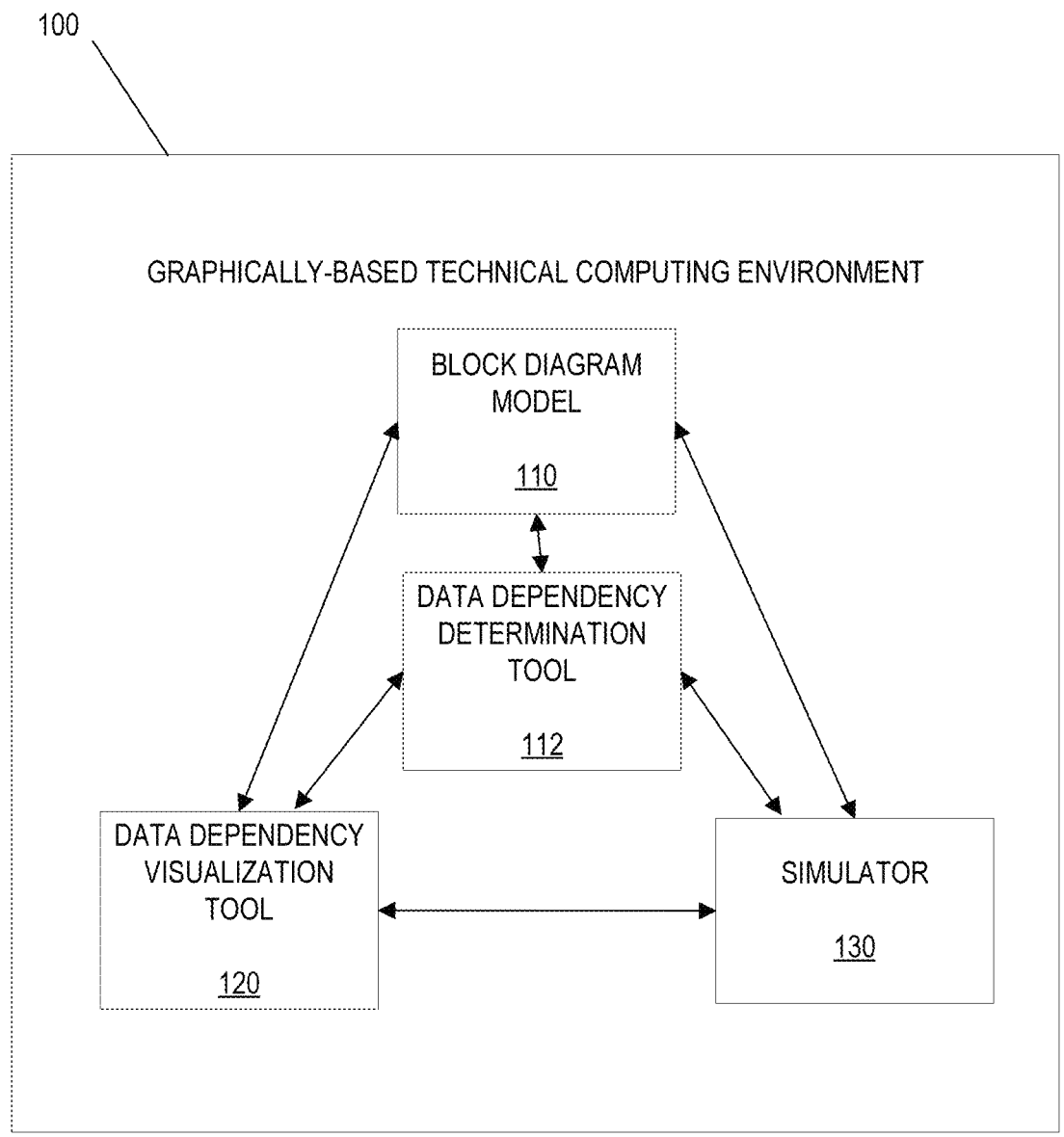
FIG. 1 illustrates an example system for a graphically-based technical computing environment according to an illustrative embodiment.

FIG. 1 illustrates an example system for graphically-based technical computing environment (TCE) 100 according to an illustrative embodiment. TCE 100 may include block diagram model 110, data dependency determination tool 112, data dependency visualization tool 120, and simulator 130. Model 110 may include one or more blocks, where the one or more blocks may represent one or more dynamic equations. The blocks of block diagram model 110 may have functionality, behavior, logic, semantics, computations, and/or execution behavior defined by text, a programming language diagrams, computer code, discrete event system specification (DEVS), hardware logic, etc. Model 110 may also be hierarchical. For example, a portion of model 110 may itself be a block within a larger second portion of model 110.

Determination tool 112 may interact with model 110. For example, determination tool 120 may generate data dependencies for model 110. The data dependencies of model 110 may be determined based on the data dependency of the blocks that make up model 110. A portion of model 110 may comprise a graphical model such as a time-based block diagram, a noncausal diagram, a state transition diagram, an activity diagram, a dataflow diagram, a control flow diagram, a state transition matrix, a truth table, a Petri net, and a discrete event network (e.g., a DEVS diagram). A portion of model 200 may include the entire model or part of model 200.

Visualization tool 120 may interact with model 110 and determination tool 112. Visualization tool 120 may visualize data dependencies determined by determination tool 112 for model 110. Visualization tool 120 may visualize various types of visualizations, as described below.

Simulator 130 may execute model 110. Data dependencies in model 110 may change during simulation or execution of model 110. One reason for changes may be that data dependencies may be affected by conditional relations, such as a relation between input and output of a subsystem. Accordingly, determination tool 112 may re-determine data dependencies during execution of model 110 by simulator 130 and the re-determined data dependencies may be visualized by visualization tool 120.

Illustrative Block Diagram Model

Figure 2:
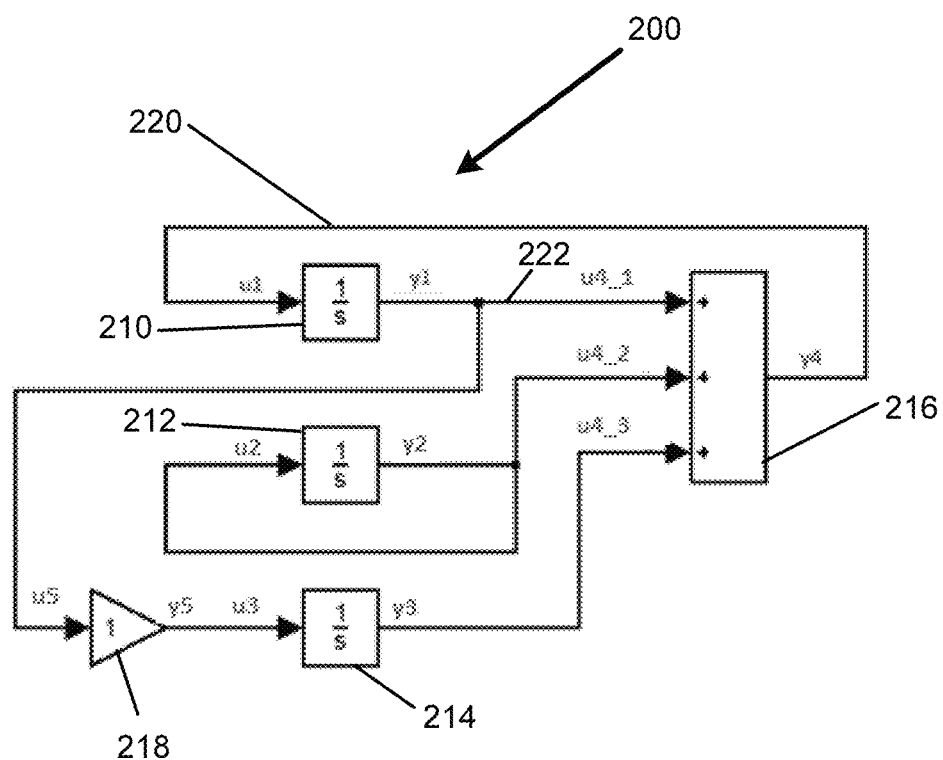
FIG. 2 illustrates an exemplary block diagram model according to an illustrative embodiment.

FIG. 2 illustrates an exemplary block diagram model 200. Model 200 includes multiple blocks and multiple connections.

Model 200 includes an integrator block 210, a second integrator block 212, a third integrator block 214, a sum block 216, and a gain block 218. An input of integrator block 210 is connected to the output of sum block 216 by connection 220. An output of integrator block 210 is connected to an input of sum block 216 by connection 222.

Data dependencies associated with integrator block 210 may be reported by indicating connections 220 and 222 and sum block 216, for example by highlighting the connections 220 and 222 and sum block 216.

Data dependencies may also be distinguished (e.g., visually highlighted) between two or more of a synthesized input, synthesized output, synthesized state, or synthesized derivative of the portion of model 200. The term synthesized is used because the synthesized input, synthesized output, synthesized state, and synthesized derivative may not correspond with an actual input, output, state, or derivative of the portion of model 200.

A synthesized input may be an input defined by a user. A synthesized output may be an output defined by the user. A synthesized state may be a state defined by the user. A synthesized derivative may be a derivative defined by the user. Other embodiments may allow the synthesized input, synthesized output, synthesized state, and/or synthesized derivative to be pre-defined and/or programmatically determined.

Model 200 may represent a dynamic system. Dynamic systems may be modeled in simulation environments as sets of differential, difference, and/or algebraic equations. These equations may be either in explicit or implicit form. At any given instant of time, these equations may be viewed as relationships between the system's output response ("outputs"), the system's input stimuli ("inputs") at that time, the current state of the system, the system parameters, and time. The state of the system may be thought of as a numerical representation of the dynamically changing data and/or configuration of the system. For instance, a signal-processing system that filters a signal may maintain a set of previous inputs as the state. The system parameters may be the numerical representation of the static (unchanging) data and/or configuration of the system and may be viewed as constant coefficients in the system's configuration.

The sample time may be the time interval at which the inputs, state, or outputs (collectively referred to as the results) of the system may be traced as time progresses. Each of the inputs, state, and outputs may have a different sample time and all the different sample times may have a common base rate. A discrete-time system may be a system in which the evolution of the system results may be tracked at finite intervals of time. In the limit as the interval approaches zero, the discrete-time system may become a continuous-time system. The intervals of time may be periodic or non-periodic. Sometimes non-periodic rate systems may be referred to as non-uniform rate systems, meaning that there is no periodic rate at which the response may be tracked. Non-uniform-rate systems may fall into the class of composite systems where an additional equation (GetTimeOfNextVarHit) may define when in the future the other equations associated with the system should be evaluated.

A model block in model 200 may be represented by the equations:

$$\begin{cases} \dot{x} = f(x, u, t) \\ y = g(x, u, t) \end{cases} \tag{1}$$

These equations may also be known as a set of dynamic equations. Equations (1) are based on state x of the model block, input u of the model block, and time t. Time-derivative, or derivative, $\dot{x}$ of the model block is determined by function $f$. Output y of the model block is determined by function g. Derivative $\dot{x}$, state x, input u, and output y may also be referred to as variables of the model block.

In a continuous-time model block, the equation for $\dot{x}$ is called a derivative function, and the equation for y is called an output function. For a discrete-time model block, the derivative equation may be replaced by an update function and the time derivative variable by a time delay variable. For simplicity, continuous-time systems are described herein, but techniques described herein may be applied to discrete-time systems, discrete-event systems, and hybrid systems. Hybrid systems may be dynamic systems that contain both continuous and discrete states, for example, continuous-time and discrete-time states.

Further, derivatives do not need to be derivatives with respect to time. For example, derivatives may be with respect to distance where the derivative may be a partial derivative. In addition to Partial Differential Equations (PDEs), techniques may also apply to Differential and Algebraic Equations (DAEs) where the derivative $\dot{x}$ in equations (1) may be multiplied by a matrix other than the identity matrix.

Derivatives of equations (1) may be derived with respect to state x, input u to determine the effect of state x, input u on derivative $\dot{x}$, and output y of the block.

A Jacobian matrix for the model block may be defined as a matrix of partial derivatives of the function $f$ with respect to state x and input u, and function g with respect to state x and input u:

$$J = \begin{bmatrix} \frac{\partial f}{\partial x} & \frac{\partial f}{\partial u} \\ \frac{\partial g}{\partial x} & \frac{\partial g}{\partial u} \end{bmatrix} = \begin{bmatrix} A & B \\ C & D \end{bmatrix} \quad (2)$$

The Jacobian matrix may include derivatives with respect to synthesized state and/or input values. For example, a synthesized state may be determined by an algebraic relation between states of one or more model blocks described by equation (1).

As can be seen in equation (2), the Jacobian matrix J may be made of Jacobian block matrices A, B, C, and D.

Jacobian block matrix A may be determined from the partial derivative of function $f$ with respect to state x. Jacobian block matrix B may be determined from the partial derivative of the $f$ function with respect to input u. Jacobian block matrix C may be determined from the partial derivative of function g with respect to state x. Lastly, Jacobian block matrix D may be determined from the partial derivative of function g with respect to input u.

In general, a Jacobian matrix is a time varying matrix as the values of its matrix elements may change over time. However, for some functions, some of the elements in a Jacobian matrix may always be zero. For example, consider the following functions:

$$\begin{cases} \dot{x}_1 = x_2^2 \\ \dot{x}_2 = x_1 + x_2 \end{cases} \quad (3)$$

The Jacobian block matrix A represents how $\dot{x}_1$ and $\dot{x}_2$ depend on $x_1$ and $x_2$. For the function above, the A matrix is:

$$A = \begin{bmatrix} 0 & 2x_2 \\ 1 & 1 \end{bmatrix}. \quad (4)$$

$A_{11}$ corresponds to the effect of $x_1$ on $\dot{x}_1$. $A_{21}$ corresponds to the effect of $x_2$ on $\dot{x}_2$. $A_{21}$ and $A_{22}$ correspond to the effect of $x_1$ and $x_2$ on $\dot{x}_2$, respectively.

In this example, $A_{11}$, the upper left element in the matrix may always be zero. Such elements that are always zero may be called "hard zeroes." On the other hand, $A_{12}=2x_2$. Accordingly, $A_{12}$ could be zero if $x_2$ is zero. Elements that may sometimes be zero may be called "soft zeroes."

From a Jacobian matrix, a corresponding pattern matrix may be constructed, for example, by replacing any non-hard zero elements in the Jacobian matrix by a one. In another embodiment, a Boolean matrix may be created in which the non-hard zero elements may be replaced by True and the hard zero elements by False. The pattern matrix may reflect the structure or data dependency in a block or system of equations. Users may find that the use of pattern equations allows them to visualize aspects of structures and/or data dependencies within a block/system. A constructed pattern matrix may be called a Jacobian pattern, or a sparsity pattern matrix. For a Jacobian block matrix, the pattern matrix may also be referred to as a Jacobian block pattern. For the above example, the block Jacobian pattern $A_p$ of the Jacobian block matrix A may be:

$$A_p = \begin{bmatrix} 0 & 1 \\ 1 & 1 \end{bmatrix} \quad (5)$$

where p stands for pattern.

For example, $A_{p,11}=0$ means that in the above equations, $x_1$ is not needed for the computation of $\dot{x}_1$. In other words, $X_1$ is not dependent on $x_1$. $A_{p12}=1$ means depends on $x_2$. As can be seen in the function for $\dot{x}_1$, $\dot{x}_1$ is calculated based on $x_2$. If $\dot{x}_1$ is based on $x_2$, $\dot{x}_1$ may also be referred to as reachable from $x_2$.

The Jacobian block patterns may be calculated based on equations that blocks represent. Jacobian block patterns may also be pre-defined. In the case where the block Jacobian pattern is pre-defined, the pattern may be defined by an author of a model block. For example, the author may specify a boolean-valued pattern matrix, edge list, incident list, etc., from which the pattern may be inferred. The specification may be in graphical and/or textual form. The specification may then be retrievable when needed. For a block defined by the functions:

$$\begin{cases} \dot{x} = f(x, u, t) \\ y = g(x, u, t) \end{cases} \quad (6)$$

the data dependency of the above equations may be defined based on Boolean-values as:

$$\dot{x} \leftarrow A_p x + B_p u$$

$$y \leftarrow C_p x + D_p u \quad (7)$$

where '+' may be evaluated as 'or'.

Given $A_{p,mn}$, where m represents a row and n represents a column in the Jacobian pattern $A^P$, $A_{p,mn}=1$ means $\dot{x}_m$, depends on $x_n$, meaning $x_n$ appears in the right hand side of the equation to compute $\dot{x}_m$. In other words, $\dot{x}_m$ can be reached from $x_n$.

Similarly, $B_{p,mn}=1$ means $\dot{x}_m$ depends on $u_n$, meaning $u_n$ appears in the right-hand side of the equation to compute $\dot{x}_m$. Correspondingly, $C_{p,mn}=1$ means $y_m$ depends on $x_n$, meaning $x_n$ appears in the right hand side of the equation to compute $y_m$. Likewise, $D_{p,mn}=1$ means $y_m$ depends on $u_n$, meaning $u_n$ appears in the right hand side of the equation to compute $y_m$.

Illustrative Examples of Data Dependency Graphs

Data dependencies in blocks may be visualized as data dependency paths.

Figure 3:
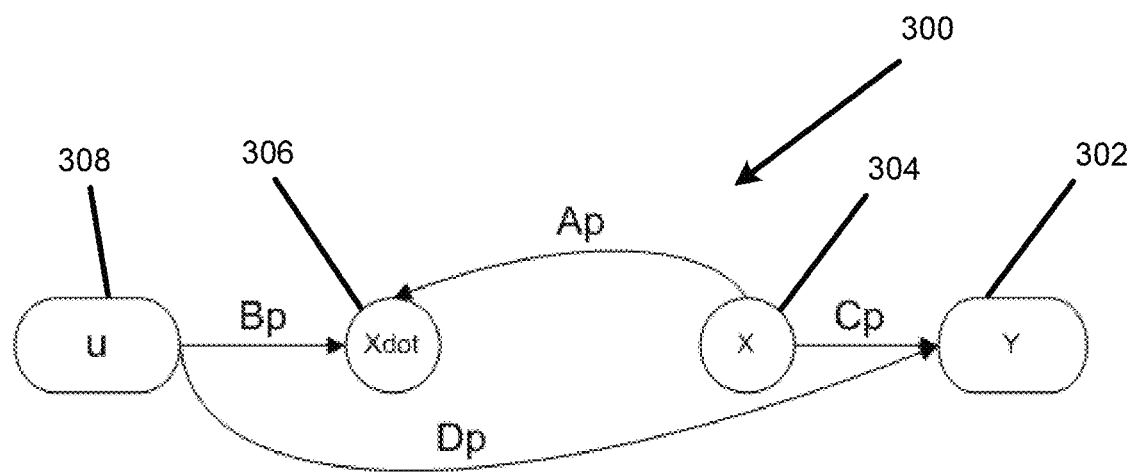
FIG. 3 illustrates an example data dependency path according to an illustrative embodiment.

FIG. 3 illustrates example data dependency graph 300 according to an illustrative embodiment. Graph 300 may visually represent variables and dependencies between variables. As can be seen in graph 300, first node 302 may represent y, second node 304 may represent x, third node 306 may represent $\dot{x}$, and fourth node 308 may represent u. Further, edges may represent $A_p$, $B_p$, $C_p$, and $D_p$. As can be seen by the edges and nodes in graph 300, y is dependent on x according to $C_p$ and dependent on u according to $D_p$. Variable $\dot{x}$ is dependent on u by $B_p$ and dependent on x by $A_p$. Lastly, u and x are independent of any of the nodes.

The dependency graph 300 may represent the dependencies in a model block. It is noted that the nodes for x and $\dot{x}$ are internal nodes that may not be directly accessed from outside the model block. On the other hand, the nodes for u and y may be used to connect the model block with other model blocks.

Graph 300 may be constructed by creating a directed graph treating variables x, $\dot{x}$, u and y as nodes, and Jacobian block pattern matrices $A_p$, $B_p$, $C_p$, and $D_p$ as the edges between these nodes. Accordingly, path 300 may represent Jacobian pattern matrices.

Referring back to FIG. 2, according to an illustrative embodiment, to determine Jacobian block pattern $A_p$ of the model 200, Jacobian patterns of the model blocks are first determined. Beginning with the integrator model blocks 210, 212, 214, the equations for an integrator model block are given below:

$$\begin{cases} \dot{x} = 0x + u \\ y = x + 0u \end{cases} \quad (8)$$

Figure 4:
FIG. 4 illustrates an example data dependency path of an integrator according to an illustrative embodiment.

FIG. 4 illustrates an example data dependency graph of an integrator model block according to an illustrative embodiment.

Next, for gain model block 218, the equations for a gain model block with factor k are:

$$\begin{cases} \dot{x} = 0x + 0u \\ y = 0x + ku \end{cases} \quad (9)$$

Figure 5:
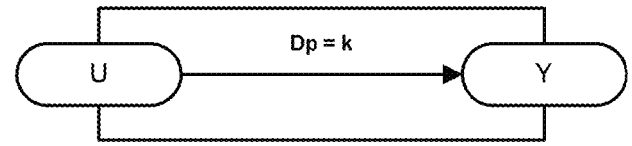
FIG. 5 illustrates an example data dependency path of a gain block according to an illustrative embodiment.

FIG. 5 illustrates an example data dependency graph of a gain model block according to an illustrative embodiment. FIG. 5 does not include a node for $\dot{x}$ or x because these variables do not affect the behavior of the model block, as seen in equations (9).

Lastly, for sum model block 216, the equations for a sum model block (or add model block) with three inputs are as follows:

$$\begin{cases} \dot{x} = 0x + 0u \\ y = u1 + u2 + u3 \end{cases} \quad (10)$$

Figure 6:
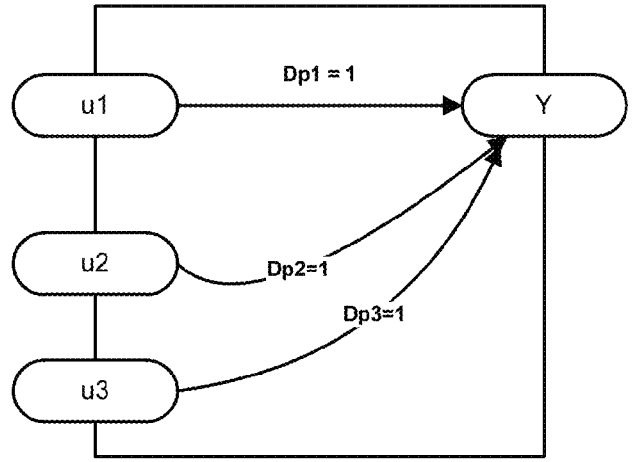
FIG. 6 illustrates an example data dependency path of a sum block according to an illustrative embodiment.

FIG. 6 illustrates an example data dependency graph of a sum model block with three inputs according to an illustrative embodiment. FIG. 6 also does not include a node for $\dot{x}$ or x because these variables do not affect the behavior of the block, as seen in equations (10).

Figure 7:
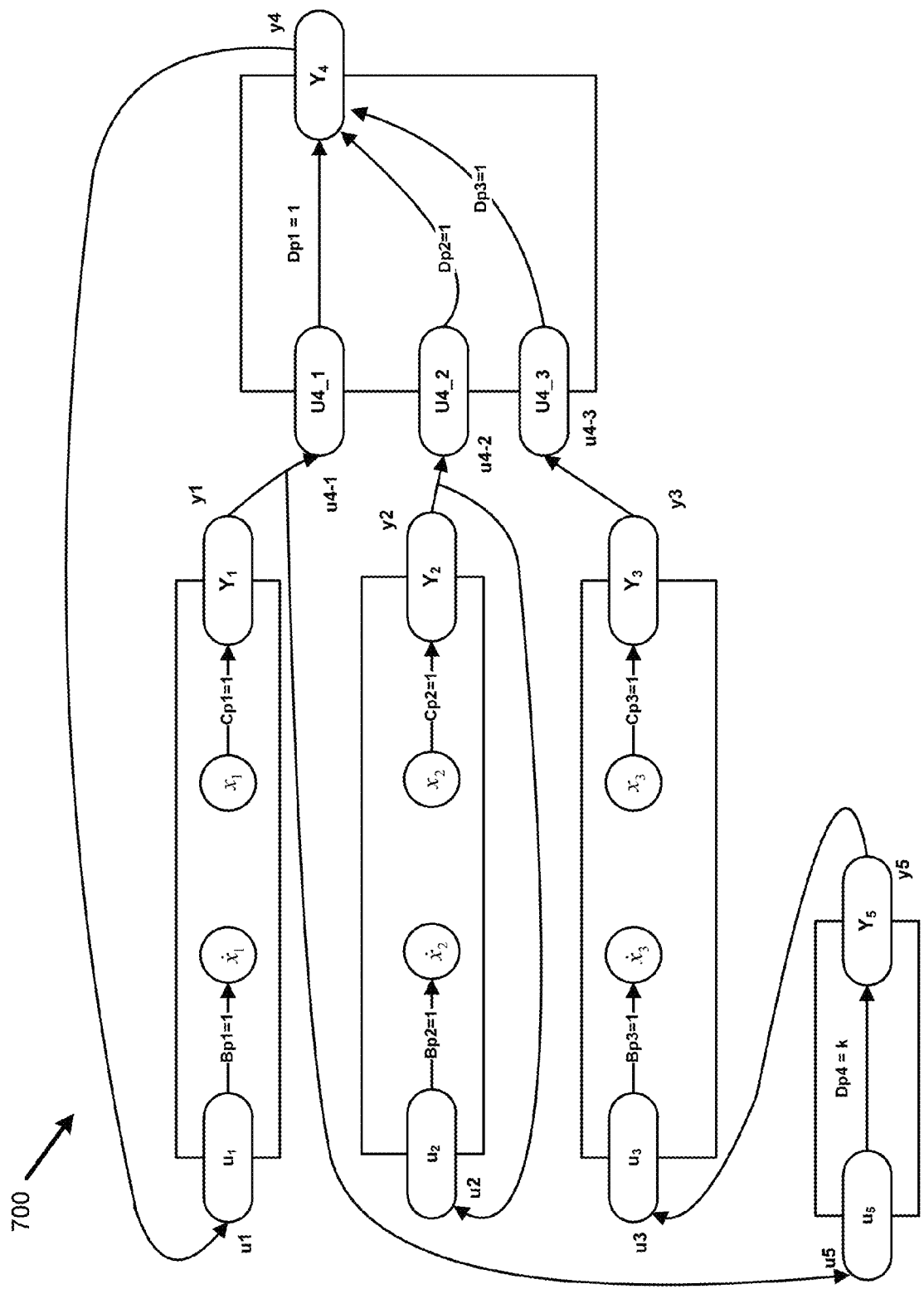
FIG. 7 illustrates an example data dependency path of the block diagram model of FIG. 2 according to an illustrative embodiment.

FIG. 7 illustrates an example data dependency graph 700 of the entire model 200 of FIG. 2 according to an illustrative embodiment. The individual data dependency graphs representing block Jacobian patterns for the model blocks may be connected together to form the graph of the entire model. The data dependency graph of the entire model may represent an open loop Jacobian pattern.

An open-loop Jacobian pattern may be a Boolean-valued matrix defined for a portion of a model (e.g., a block diagram). For example, suppose the model blocks in the portion are given as the ordered set $\{blk_1, blk_2, blk_n\}$, the open-loop Jacobian pattern may be defined as $$J_p^o = \begin{bmatrix} A_p^o & 0 & B_p^o & 0 \\ C_p^o & 0 & D_p^o & 0 \\ 0 & E_p^o & 0 & F_p^o \\ 0 & G_p^o & 0 & H_p^o \end{bmatrix} \quad (11)$$

where O means open-loop and:

$$A_p^o = \begin{bmatrix} A_{p,1}^o & 0 & 0 \\ 0 & \ddots & 0 \\ 0 & 0 & A_{p,n}^o \end{bmatrix} \quad (12)$$

$A_{p,j}^o$, j=1, 2, ..., n$A_{p,j}$, j=1, 2, ..., n are Jacobian block matrices $A_p$ $A_p^o$; of the model blocks 1 through n in the model.

Similarly, we have:

$$B_p^o = \begin{bmatrix} B_{p,1}^o & 0 & 0 \\ 0 & \ddots & 0 \\ 0 & 0 & B_{p,n}^o \end{bmatrix} \quad (13)$$

$$C_p^o = \begin{bmatrix} C_{p,1}^o & 0 & 0 \\ 0 & \ddots & 0 \\ 0 & 0 & C_{p,n} \end{bmatrix} \quad (14)$$

$$D_p^o = \begin{bmatrix} D_{p,1}^o & 0 & 0 \\ 0 & \ddots & 0 \\ 0 & 0 & D_{p,n}^o \end{bmatrix} \quad (15)$$

The open loop Jacobian pattern of a model may be determined based on a data dependency graph. There are several ways to generate the graph of a received model. One embodiment to generate a graph is to use an adjacency matrix. An adjacency matrix may be a matrix representing which nodes of a graph are connected to which other nodes. The graph of model 110 may be represented as the following matrix:

TABLE 1

$J_p^o$: Adjacency matrix of the data dependency graph of a block diagram model:

|  | X | $Y_b$ | $U_b$ | $U_{root} Y_{root}$ |
|---|---|---|---|---|
| $\dot{X}$ | $A_p^O$ | 0 | $B_p^O$ | 0 |
| $Y_b$ | $C_p^O$ | 0 | $D_p^O$ | 0 |
| $U_b$ | 0 | $E_p^o E$ | 0 | $F_p^o F$ |
| $Y_{root} U_{root}$ | 0 | $G_p^o G$ | 0 | $H_p^o H$ |

The $E_p^o$, $F_p^o$; $G_p^o$; $H_p^o$; matrices describe the interconnections among model block inputs, $U_b$, model block outputs, $Y_b$, and model inputs, $U_{root}$, and model outputs $Y_{root}$ of the model.

Adjacency matrix $J_p^O$ may be generated by assembling $A_p^o$, $B_p^o$, $C_p^o$, $D_p^o$ from the Jacobian block pattern matrices and the $E_p^o$, $F_p^o$, $G_p^o$, $H_p^o$ matrices.

The open-loop Jacobian pattern of a model may be used to determine a closed loop Jacobian pattern of the model. The closed loop Jacobian pattern may be distinguished from the open loop Jacobian pattern as the closed loop Jacobian pattern may represent dependencies between variables in the model.

Suppose a portion of a model (e.g., represented by a block diagram) is given as x=f(y) q=f(z), where q and z are vectors of variables, which contain either algebraic variables (e.g., u), state variables (e.g., x), or the time derivatives of state variables (e.g., $\dot{x}$), the closed-loop Jacobian pattern of the portion is then defined as $I_p^c = \lfloor e_{i,j} \rfloor$, where the elements of the matrix $I_p^c$ are defined as:

$$e_{i,j} = \begin{cases} 1, & \text{if } y_i \text{ is dependent on } x_j \\ 0, & \text{otherwise} \end{cases} \quad (16)$$

From the open loop Jacobian pattern $J_p^O$, the transitive closure between nodes in the adjacency matrix may be found to obtain a corresponding closed loop Jacobian pattern for the model with Jacobian block pattern matrices, $A_p^c$, $B_p^c$, and $C_p^c$, and $D_p^c$, where the superscript c may stand for closed. The transitive closure between $\dot{x}$ $\dot{x}_m$, and $x$ $x_n$ yields $A_p^c$. The transitive closure between $\dot{x}$ $\dot{x}_m$ and $u_{root}u_{root\_n}$ yields $B_p^c$. The transitive closure between x $x_m$ and $y_{root}$ $y_{root\_n}$ yields $C_p^c$. The transitive closure between $y_{root}$ $u_{root}$ yields $D_p^c$.

A closed loop Jacobian pattern may be determined by determination tool 112 using the data dependency graph of the entire model. For example, determining whether $\dot{x}$ is dependent on x in the entire model may be based on determining if $\dot{x}_m$ can be reached from $x_n$ in the data dependency graph. Determining if $\dot{x}_m$ can be reached from $x_n$ may be done by applying a search algorithm.

By way of example, a search algorithm may be implemented as follows for graph 700 of model 200. Starting from a node $\dot{x}_m$, trace back to see if any state $x_n$ can be reached. For example:

a. $\dot{x}_1$ is dependent on $u_1$ (the connection between $\dot{x}_1$ and $u_1$ is $B_p$ $C_p$),
  b. $u_1$ is driven by $y_4$. $y_4$ is dependent on $u_{4\text{-}1}$, $u_{4\text{-}2}$, and $u_{4\text{-}3}$ (the connections between them are $D_{p,11}$, $D_{p,21}$, $D_{p,31}$ of sum model block 216, which are Dp1, Dp2, and Dp3 in FIG. 7, respectively),
  c. $u_{4\text{-}1}$, $u_{4\text{-}2}$, $u_{4\text{-}3}$ are dependent on $y_1$, $y_2$, $y_3$, respectively (connected through an E matrix, which describes the connections between inputs of model blocks and outputs of model blocks), and
  d. $y_1$, $y_2$, $y_3$ are dependent on $x_1$, $x_2$, $x_3$, (through the $C_p$ matrix of the respective integrators 210, 212, and 214).

Using the example, it can be determined that $\dot{x}_1$, can be reached from $x_1$, $x_2$, $x_3$.

Similar procedures may be applied to $\dot{x}_2$ and to $\dot{x}_3$. Accordingly, it may be determined that $\dot{x}_2$ is only reachable from $x_2$, and that $\dot{x}_3$ is only reachable from $x_1$. Thus, the closed loop Jacobian block pattern matrix $A_p^c$ of example model 200 may be:

$$A_p^c = \begin{bmatrix} 1 & 1 & 1 \\ 0 & 1 & 0 \\ 1 & 0 & 0 \end{bmatrix} \quad (17)$$

Procedures similar to the procedure to find $A_p^c$, as described above, may be applied to find $B_p^c$, $C_p^c$, and $D_p^c$.

The search algorithm may be such that it identifies reachability between nodes (e.g., one of a depth first search, breadth first search, and A* search):

$A_p^c: \dot{x} \leftarrow x$ $B_p^c: \dot{x} \leftarrow u_{root}$ $C_p^c: y_{root} \leftarrow x$ $D_p^c: y_{root} \leftarrow u_{root} A_p^c: \dot{x}_n \leftarrow x_n \quad B_p^c: \dot{x}_m \leftarrow u_{root\_n} C_p^c:$
$y_{root\_m} \leftarrow x_n D_p^c y_{root\_m} \leftarrow u_{root\_n}$ (18)

where $u_{root}u_{root\_n}$ is an input of the model, $y_{root}y_{root\_n}$ is an output of the model. For simplicity, the above example described in reference to FIG. 7 does not have model input/output.

Accordingly, $A_p^c(i,j)=1$ means there is a directed path that connects $x_1$ to $B_p^c(i,j)=1$ means there is a directed path that connects $u_{root\_j}$ to $\dot{x}_i$. $C_p^c(i,j)=1$ means there is a directed path that connects $x_j$ to $y_{root_i x_i}$. $D_p^c(i,j)=1$ means there is a directed path that connects $u_{root\_j}$ to $y_{root_i x_i}$.

In the case of a hierarchical block diagram model, a closed loop Jacobian pattern of a first portion of the model may be hierarchically determined by treating a second portion of the model as a model block within the first portion. Therefore, the closed loop Jacobian pattern of the second portion may then be considered to be the Jacobian block patterns of a model block within the first portion representing the second portion.

Example Processing for Data Dependency Visualization

Figure 8:
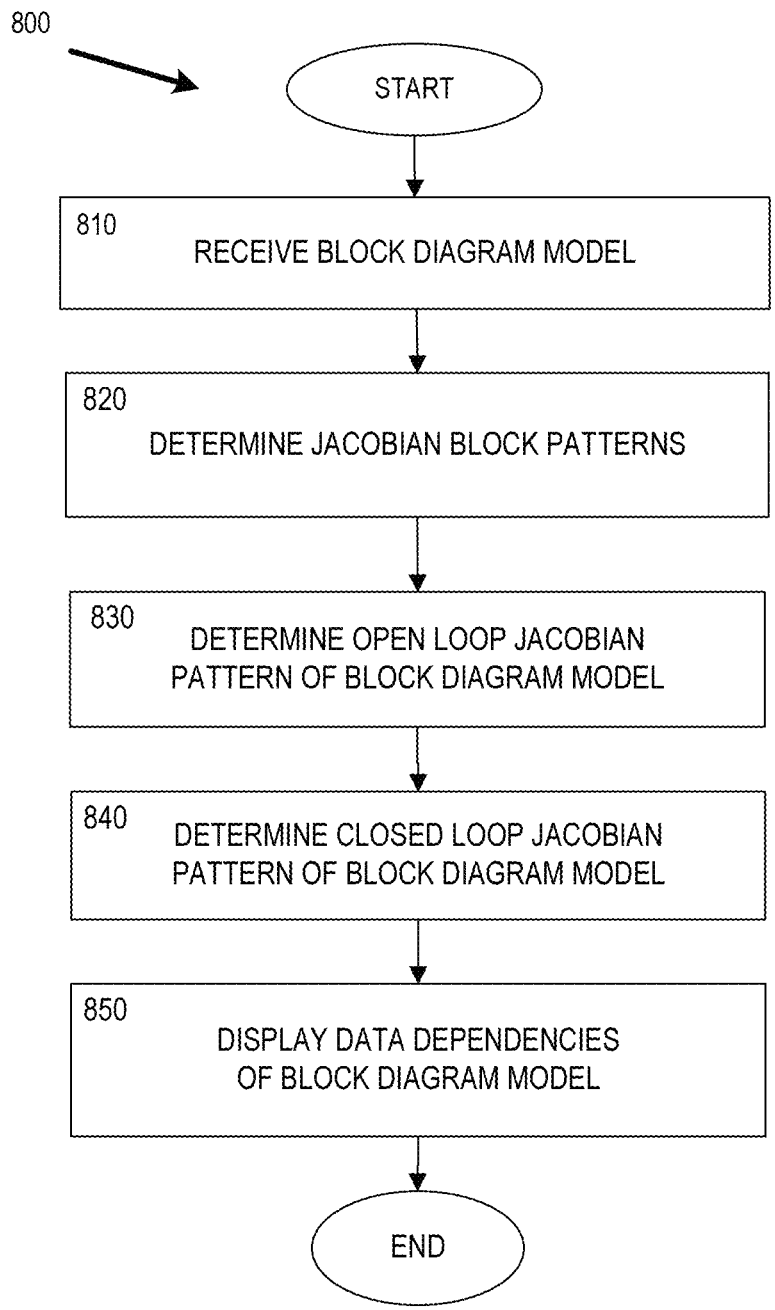
FIG. 8 illustrates exemplary processing for visualizing data dependency information according to an illustrative embodiment.

FIG. 8 illustrates exemplary processing 800 for visualizing data dependency information according to an illustrative embodiment.

Determination tool 112 may receive a block diagram model (act 810). Determination tool 112 may receive either a portion of the model or the entire model.

Determination tool 112 may determine Jacobian block patterns of the model (act 820). Jacobian block patterns may be determined based on determining one or more Jacobian block patterns for one or more corresponding model blocks in the model. A Jacobian block pattern of a model block may be determined based on retrieving a user pre-defined pattern for the model block.

Determination tool 112 may determine an open loop Jacobian pattern of the model (act 830). The open loop Jacobian pattern may be determined based on the Jacobian block patterns of the blocks in either a portion of the model or the entire model.

Determination tool 112 may determine a closed loop Jacobian pattern of either a portion of the model or the entire model (act 840). The closed loop Jacobian pattern of the model may be determined based on the open loop Jacobian pattern.

Visualization tool 120 may indicate (e.g., display) data dependencies of the model (act 850). Visualization tool 120 may indicate (e.g., display) data dependences based on the closed loop Jacobian pattern determined by determination tool 120.

In another embodiment, Jacobian block patterns may be determined based on based on semantic representations. An example of a semantic representation may include a control flow graph. A control flow graph (CFG) may be a representation (e.g., using graph notation) of all paths that may be traversed through a software program during its execution. A semantic representation may also include a data flow graph. A data flow graph (DFG) may be a representation (e.g., using graph notation) of all paths along which data can be communicated between nodes during an execution of the computations that the DFG represents. A semantic representation may also include a combination of control flow and data flow graphs, or a net list (e.g., a list of entities such as computations and the connections between these entities). In an embodiment the various semantic representations may be in-memory representations only (e.g., an intermediate representation).

The semantic representation of a model block in the received block diagram model may be determined computationally by determination tool 112. In the case where the semantic representation is a CFG, the CFG can be generated based on a function, for example, a code generation function of Real Time Workshop® product, a product of MathWorks, Natick, Mass. The Real Time Workshop® product code generation function (RTWCGF) may be pre-defined by a user. The RTWCGF may be used to generate a CFG of an output function (e.g., g in equations (1)), derivative function (e.g., $f$ in equations (1)), or an update function (e.g., the discrete-time equivalent of $f$ in equations (1)).

The functions, and thus the CFG, may also correspond with a portion of a block diagram model or an entire block diagram model. If the functions treat an entire block diagram model as a block, the Jacobian block patterns determined based on the semantic representation may be a closed loop Jacobian pattern of the entire block diagram model. Similarly, treating a portion of the block diagram model as a block may determine a Jacobian block pattern that is the closed loop Jacobian pattern of the portion of the block diagram model.

Figure 9:
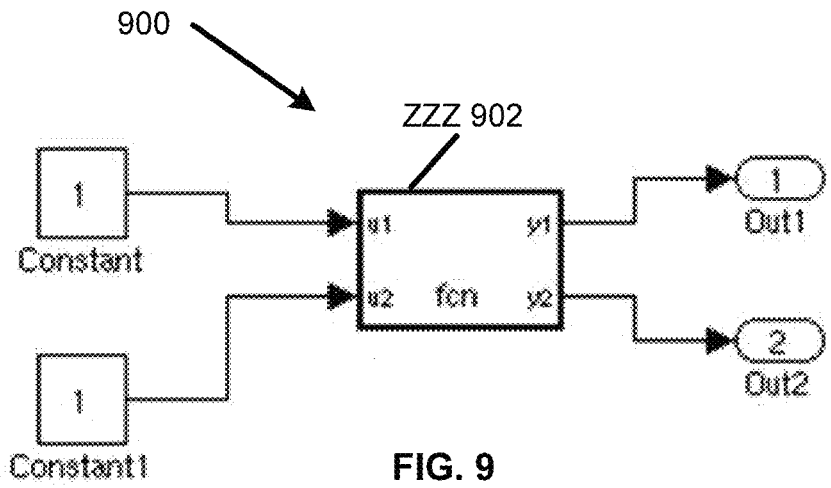
FIG. 9 illustrates an example block diagram model according to an illustrative embodiment.

FIG. 9 illustrates an example block diagram model 900 according to an illustrative embodiment. Model 900 illustrates a function ZZZ 902 receiving two inputs, u1 and u2 and returning two outputs, y1 and y2. Model 900 also has two outputs, Out1 and Out2. In the example, the source code of function ZZZ 902 written by a block author (e.g., user or other computations) may be:

function[y1,y2]=fcn(u1,u2)

k=u2/3;

y1=u1^2; (19)

y2=k*u1.

The source code of function ZZZ 902 may also be represented as a semantic representation.

Figure 10:
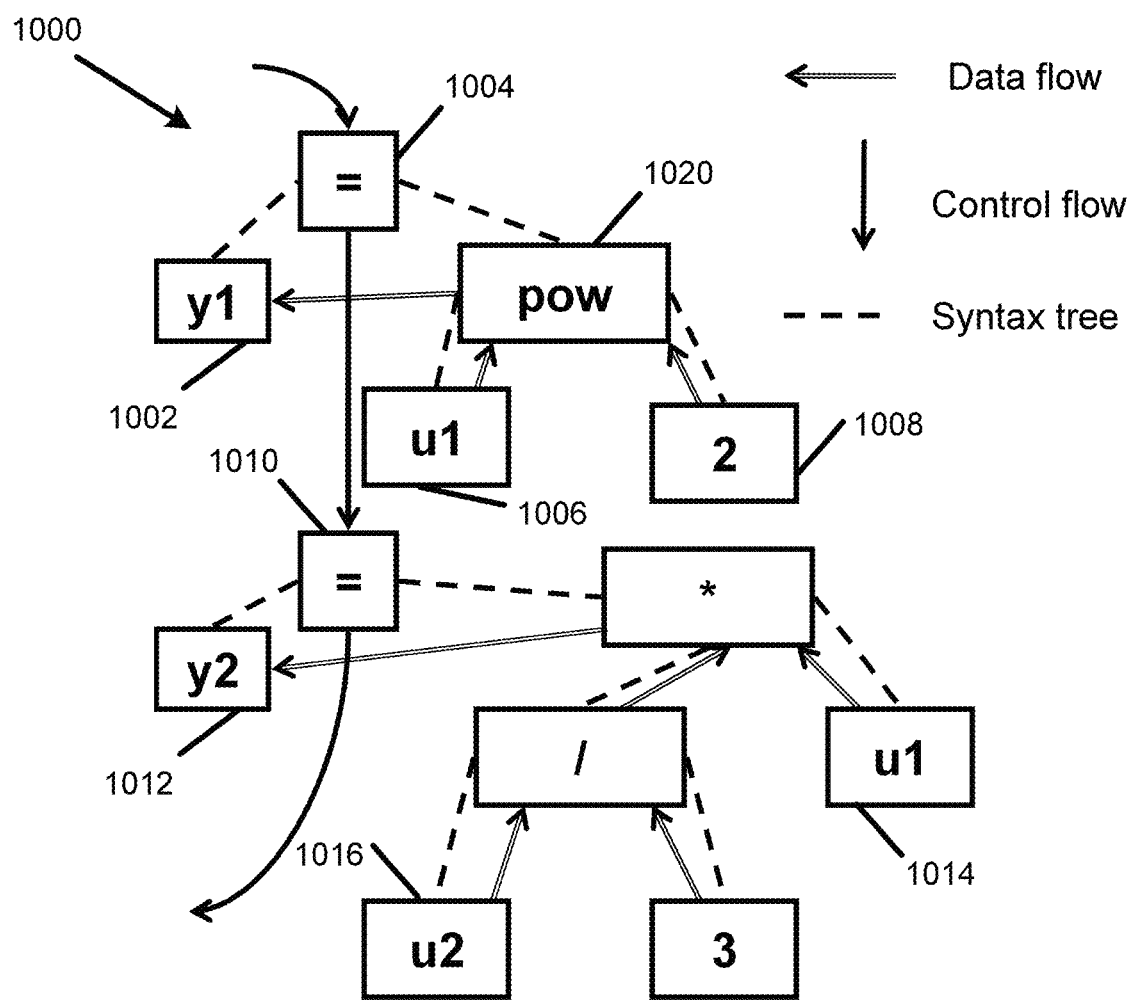
FIG. 10 illustrates an example graphical representation of a combined control flow/data flow graph (CDFG) according to an illustrative embodiment.

FIG. 10 illustrates a graphical representation 1000 of a combined control flow/data flow graph (CDFG) of function ZZZ 902 according to an illustrative embodiment. As seen in graphical representation 1000, the control flow enters at the "=" node 1004. This node represents a statement y1=pow(u1, 2) that may be represented by data flow. In the CDFG, this statement is shown by node "y1" 1002 connected to node "=" 1004. Node "y1", in turn, is connected to the 'pow' operation represented by node "pow" 1020. The node "pow" 1020 is an operation that is connected to its two input variables represented by node "u1" 1006 and node "2" 1008. Traversing the data flow graph that corresponds to node "=" 1004 from node "=" 1004 onwards reveals that node "y1" 1002 is indirectly connected to node "u1" 1006. Accordingly, node "y1" 1002 is dependent on node "u1" 1006. The control flow then reaches the next "=" node 1010 that represents a statement y2=(u2/3)*u1 that may be represented by data flow. The corresponding data flow graph representation 1000 shows node "y2" 1012 depends on u1 1014 and u2 1016. The control flow then exits the CFDG 1000.

The generated CDFG may be used to determine the Jacobian block pattern. The CDFG may be traversed to determine the dependencies of the variables within the CDFG. For example, in FIG. 10, a traversal beginning at node "y1" 1002 to node "pow" 1020 and finally to node "u1" 1006 shows y1 is dependent on u1. The CDFG may also be used to determine which variables are in the transitive closure of a given variable. For example, the CDFG may be used to determine that node "u1" 1014 and node "u2" 1016 are in the transitive closure of node "y2" 1012. The variable y2 may then be determined to be dependent on variable u1 and variable u2. The CDFG traversal may include following references such as labeled references. For example, the variable u1 is referenced by node "u1" 1006 and node "u1" 1014. Traversing the graph may include resolving this reference by tracing from one node in the graph to another that is referenced or that represents the same variable.

Figure 11:
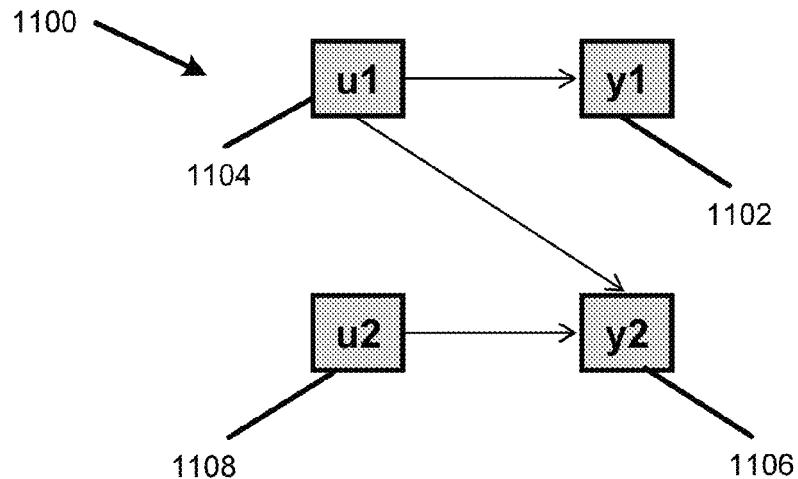
FIG. 11 illustrates an example graphical representation of a Jacobian pattern based on the dependencies in the block in FIG. 9 according to an illustrative embodiment.

FIG. 11 illustrates an example graphical representation 1100 of a Jacobian pattern for a model block based on the dependencies in function ZZZ 902 in FIG. 9 according to an illustrative embodiment. The dependencies are between y1, y2, u1, and u2. As can be seen in graphical representation 1100, output y1 1102 depends on input u1 1104, and output y2 1106 depends on both input u1 1104 and input u2 1108. The corresponding Jacobian block pattern $D_p$ matrix for the model block is:

$$[1\ 0; 1\ 1] \tag{20}$$

Example Processing Technique for Generating Symbolic Equation Structures

A closed loop Jacobian may be used to generate symbolic equation structures. Symbolic equation structures may symbolically represent data dependencies in a block diagram model. An example structure of a symbolic equation may be:

$$\dot{x}_1 = f_1(x_1, x_2, X_3)$$

$$\dot{x}_2 = f_2(x_2)$$

$$\dot{x}_3 = f_3(x_1) \tag{21}$$

The closed loop Jacobian block matrices $A_p^c$ and $B_p^c$, may be used to generate the structure of the derivative and/or update method of the model and the closed loop Jacobian block matrices $C_p^c$, and $D_p^c$, may be used to generate the structure of the output method. $A_p^c(i,j)=1$ may mean that $x_j$ appears in the right hand side of the equation to compute $\dot{x}_i$. The example structure of symbolic equations may represent the symbolic equations for model 200 shown in FIG. 2. In this example, the model has no model input and output port. Thus, $A_p^c$ is the only matrix necessary to generate the structure of the equations for model 200.

Figure 12:
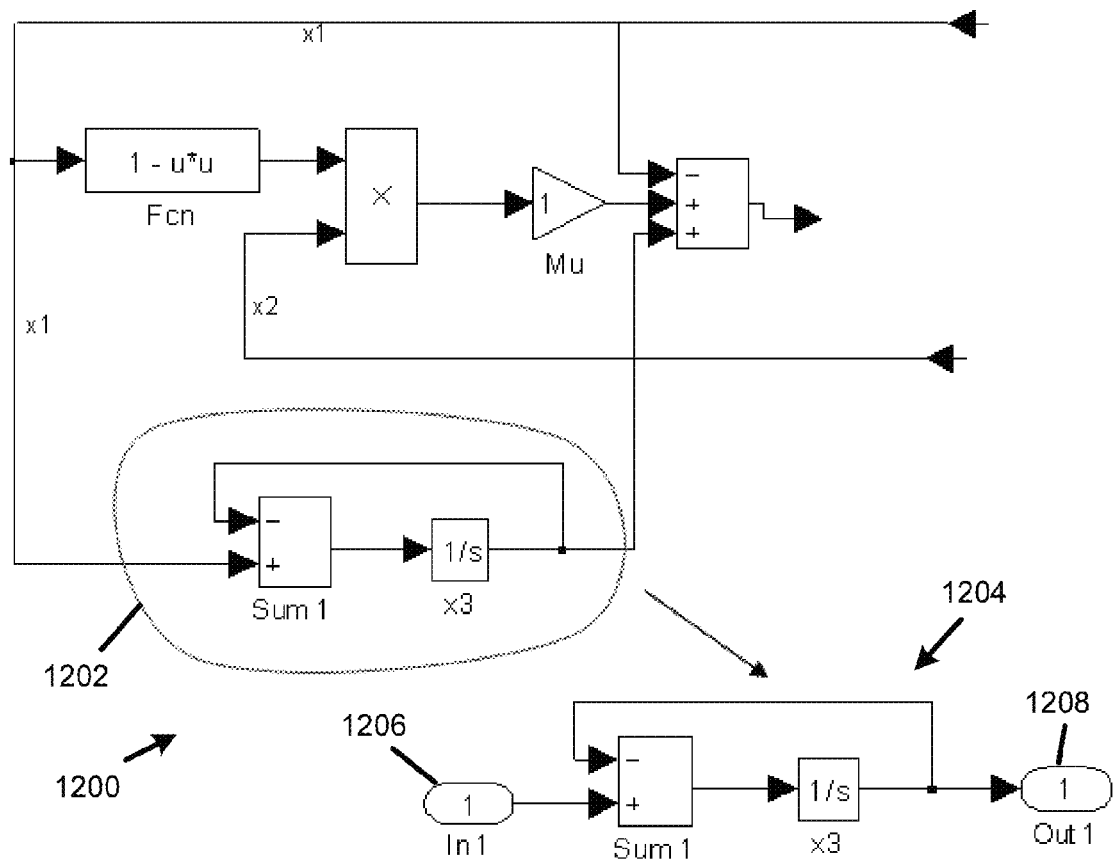
FIG. 12 illustrates an example block diagram model according to an illustrative embodiment.

FIG. 12 illustrates an example block diagram model 1200 according to an illustrative embodiment. A portion of model 1200 is defined by boundary 1202. The portion of model 1200 may be treated as subsystem 1204 with an input port 1206 and an output port 1208. As subsystem 1204 has both input port 1206 and output port 1208, the closed-loop Jacobian block pattern matrices $A_p^c$, $B_p^c$, $C_p^c$, and $D_p^c$ for the model block that represents subsystem 1204 may all be needed to generate symbolic equation structures of model 1200.

Example Processing Technique for Visualizing Data Dependencies

Determined data dependencies may be indicated to users in a number of ways.

Figure 13:
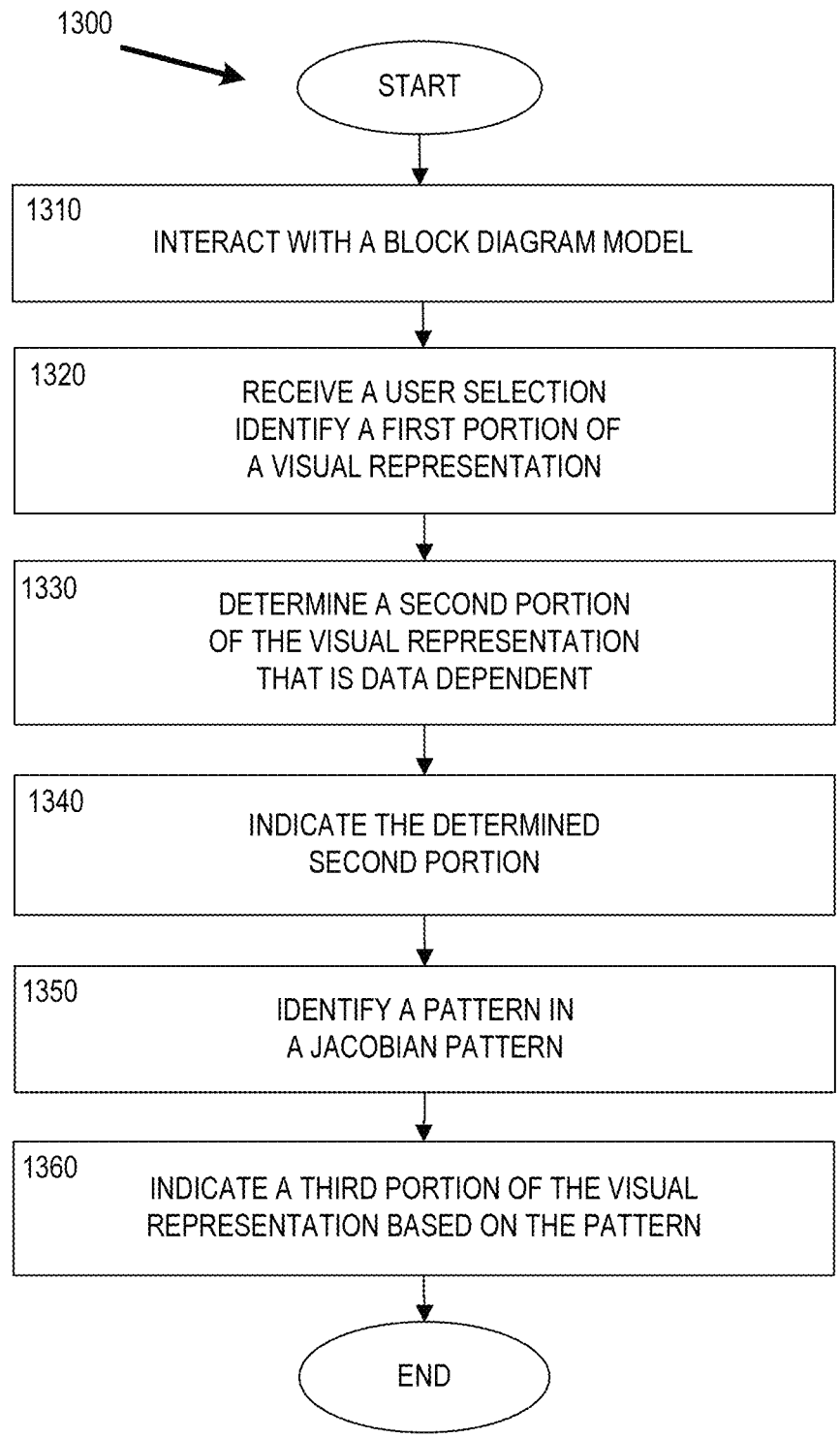
FIG. 13 illustrates exemplary processing for indicating data dependencies in a visualization according to an illustrative embodiment.

FIG. 13 illustrates exemplary processing 1300 for indicating data dependencies in a visualization according to an illustrative embodiment. The visualization may be a data dependency graph visualization. FIG. 2 previously described may be considered a data dependency graph visualization. As previously discussed, dependencies between the blocks (e.g., data dependency paths) may be indicated, for example by highlighting portions of model 200.

According to FIG. 13, data dependency visualization tool 120 may first interact with a model (act 1310). Interacting with the model may include one or more of the steps shown in the example processes of FIG. 8.

A user selection may then be received (act 1320). The user selection may identify a first portion of a visual representation of the model. For example, a user may click on a connection between blocks. Receiving the user selection may include receiving an identification of one or more variables in the model.

A second portion of the visual presentation that is data dependent on the first portion of the visual representation may then be determined (act 1330). The determining may be performed using Jacobian patterns of the model and/or of the model blocks. For example, a block with an input connected to the selected connection in the Jacobian pattern may be determined to be data dependent on the selected connection.

The determined second portion of the visual representation may then be indicated (act 1340) for example by highlighting. Highlighting may include distinguishing visually. Highlighting may include, for example, coloring, resizing, moving, outlining, blinking, lowlighting, labeling, etc. For example, the block determined to be data dependent may be colored orange.

A pattern in the Jacobian patterns of the model and/or of the model blocks may then be identified (act 1350). For example, determination tool 112 may identify a pattern indicating a third portion of the visual representation is dependent on another portion of the visual representation. A third portion of the visual representation may then be highlighted by visualization tool 120 based on the pattern (act 1360).

Models may be noncausal and include connections with multiple variables between blocks. The Jacobian pattern may be shown for the various variables in one connection in different colors. For example, if a user selects a noncausal connection that represents a force/velocity pair, this may result in the highlighting of force data dependencies in blue and velocity dependencies in green.

Figure 14:
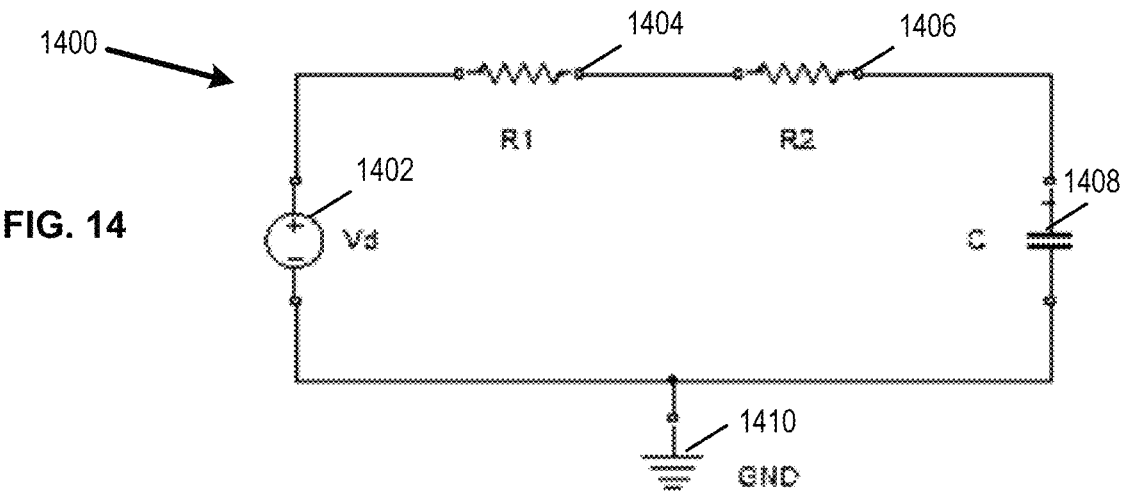
FIG. 14 illustrates an example block diagram model of an electrical circuit according to an illustrative embodiment.
Figure 15:
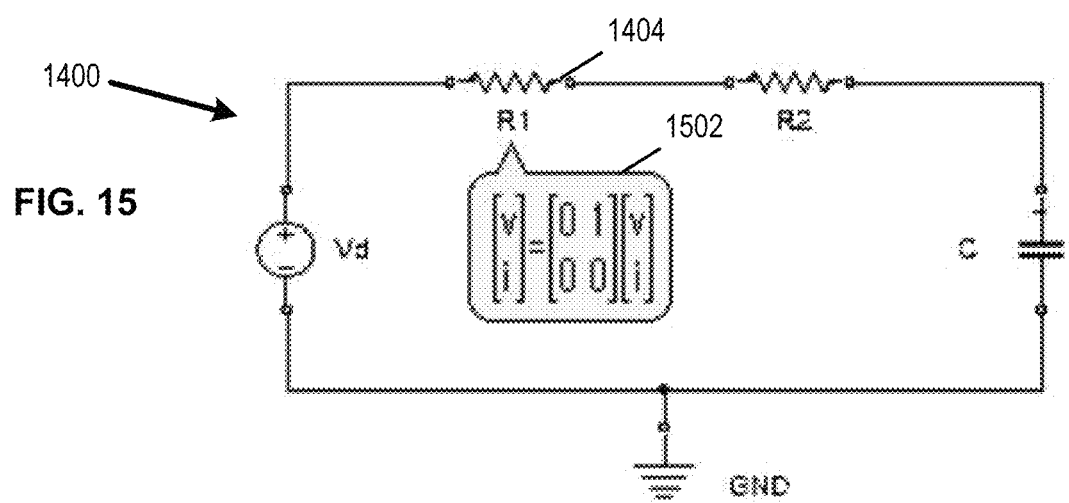
FIG. 15 illustrates a model showing dependency in the model according to an illustrative embodiment.
Figure 16:
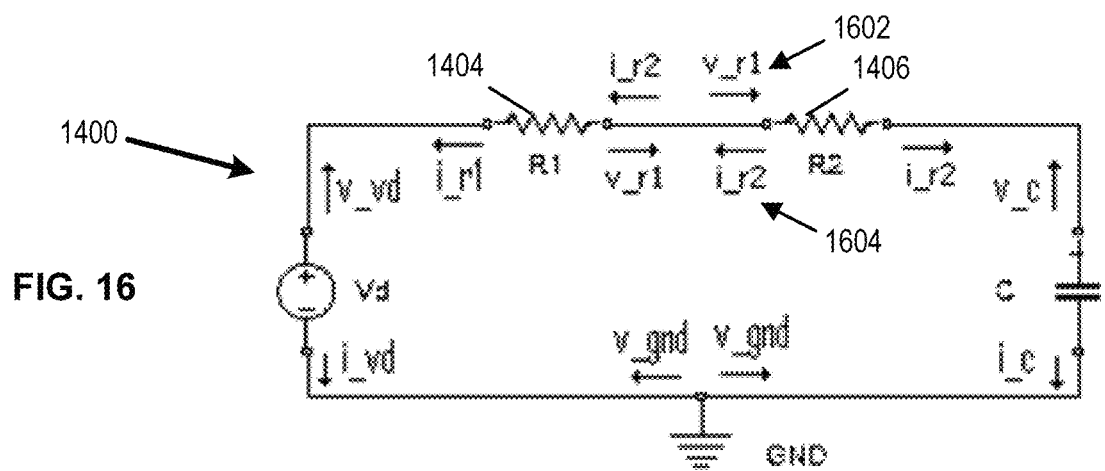
FIG. 16 illustrates a model showing a cyclic relationship according to an illustrative embodiment.

FIGS. 14-16 illustrate examples of visualizations of an electrical circuit model according to an illustrative embodiment.

FIG. 14 illustrates example block diagram model 1400 of an electrical circuit according to an illustrative embodiment. Model 1400 includes a series connection of a battery, Vd 1402, a resistor, R1 1404, a resistor, R2 1406, a capacitor, C2 1408, and a ground node, GND 1410. These electrical circuit elements may have the following equations associated with them. Vd: $v\_vd=Vd$, R1: $v\_r1=R1*i\_r1$, R2: $v\_r2=R2*i\_r2$, C: $di\_c/dt=C*v\_c$, GND: $v\_gnd=0$. Furthermore, the connections between the elements may result in a number of equations according to Kirchhoff's current law ($i\_vd=i\_r1$, $i\_r1=i\_r2$, $i\_r2=i\_c$, $i\_gnd=i\_c$) and Kirchhoff's voltage law ($v\_vd-v\_r1-v\_r2-v\_c-v\_gnd=0$). The blocks in model 1400 may be the electrical circuit elements and their equations may determine their block Jacobian patterns. For example, the block Jacobian pattern for R1 1404 may have as input variable u the value of $v\_r1$ and output variable y the value of $i\_r1$. Accordingly, the Jacobian block pattern matrix $D_p$ for model block R1 1404 may be [1]. The Jacobian pattern matrix for R2 1406 may have as input variable u the value of $i\_r2$ and output variable y the value of $v\_r2$. Accordingly, the Jacobian block pattern matrix $D_p$ for model block R2 1406 may also be [1].

In another formulation, the input variables of R1 1404 may be an array [$v\_r1$; $i\_r1$] and the output variables may be an array [$v\_r1$; $i\_r1$]. The Jacobian block pattern matrix $D_p$ for model block R1 1404 may now be [0 1; 0 0] or [0 0; 1 0], depending on whether the block equations compute $v\_r1$ or $i\_r1$ as output, respectively. The Jacobian pattern matrix and/or some of the Jacobian block pattern matrices may be visualized in model 1400.

FIG. 15 illustrates model 1400 showing dependency in model 1400 according to an illustrative embodiment. Model 1400 shows Jacobian block pattern matrix $D_p$ for model block R1 1404. This visualization may be in response to a user action, for example, moving a cursor over R1 1404. In another embodiment, if the input, output, states, and derivatives of a block are given, only the Jacobian pattern matrices may be shown. This visualization may be, for example, a dot pattern, binary pattern, Boolean pattern, etc.

Jacobian patterns for blocks with noncausal equations may be derived by determination tool 112 based on analysis of the equations that are present in model 1400 to determine an ordering that allows solving these equations. Equations that do not have a variable that is explicitly computed by the equation may be called noncausal or acausal. A noncausal equation may be formulated implicitly, for example by enforcing a right-hand or left-hand side of value 0.

The closed loop Jacobian pattern may indicate the presence of cyclic relations that may represent an algebraic loop. For example, the Jacobian block pattern matrix $D_p$ for model block R1 1404 may be [0 1; 0 0] and for model block R2 1406 may be [0 0; 1 0]. Along with the connection pattern [$i\_r1$; $i\_r2$; $v\_r1$; $v\_r2$]=[0 1 0 0;1 0 0 0;0 0 0 1; 0 0 1 0] [$i\_r1$; $i\_r2$; $v\_r1$; $v\_r2$], a closed loop Jacobian pattern may be derived such that [$i\_r2$; $v\_r1$]=[0 1;1 0] [$i\_r2$; $v\_r1$]. This closed loop Jacobian pattern may indicate that $i\_r2$ depends on $v\_r1$ and that $v\_r1$ depends on $i\_r2$, which indicates a cyclic data dependency.

Cyclic data dependencies may be indicated differently than dependencies that are not part of a cycle.

Visualization of data dependencies of models with noncausal equations may include indicating which variables are computed by, for example, which equations, which blocks, or which ports, etc.

FIG. 16 illustrates model 1400 showing a cyclic relationship according to an illustrative embodiment. In addition to indicating output values of a model element, if there is a dependency on an input value as indicated by the Jacobian block matrix D, the corresponding input value may also be indicated. All model blocks may indicate which values are their output values. In addition, or alternatively, model blocks R1 1404 and R2 1406 may show their input values ($i\_r2$ 1604 and $v\_r1$ 1602, respectively) to indicate the model blocks have a cyclic dependency.

Another interaction may be based on a 'view mode'. If a user switches from the regular model view mode to a Jacobian pattern view mode, all model blocks and connections may be replaced by their Jacobian pattern and/or data dependency relations, e.g., as a data dependency path.

Figure 17:
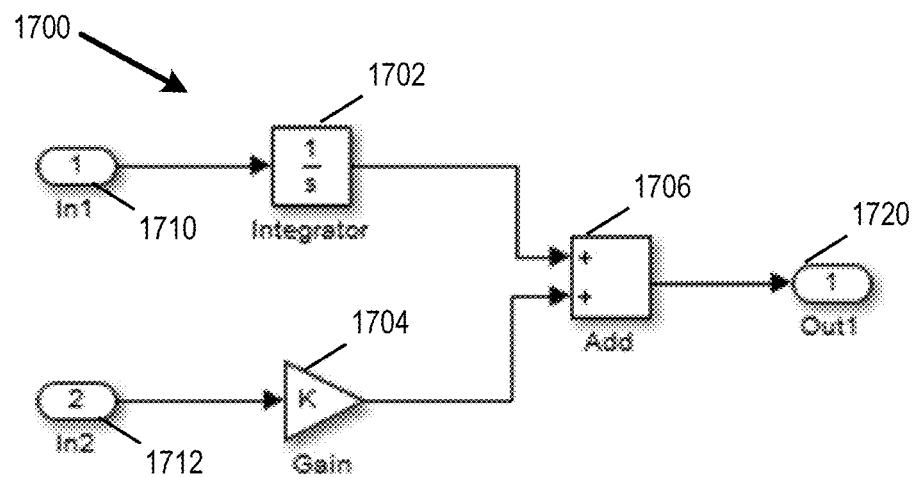
FIG. 17 illustrates a model view mode of a model according to an illustrative embodiment.

FIG. 17 illustrates a model view mode of model 1700 according to an illustrative embodiment. Model 1700 includes three model blocks, Integrator model block 1702, Gain model block 1704, and Add model block 1706. These model blocks perform operations on two inputs, In1 1710 and In2 1712, to produce one output, Out1 1720. Integrator model block 1702 integrates the input from In1 1710 with respect to time. Gain model block 1704 multiplies the input from In2 1712 with a factor K. Add model block 1706 adds the results from Integrator model block 1702 and Gain model block 1704. Output Out1 1720 equals the result from Add model block 1706. The Jacobian block pattern matrices $D_p$ for model blocks Integrator 1702, Gain 1704, and Add 1706 may be determined to be [0], [1], and [1 1], respectively. In an embodiment, the blocks may be replaced by their Jacobian pattern or Jacobian pattern matrices.

Figure 18:
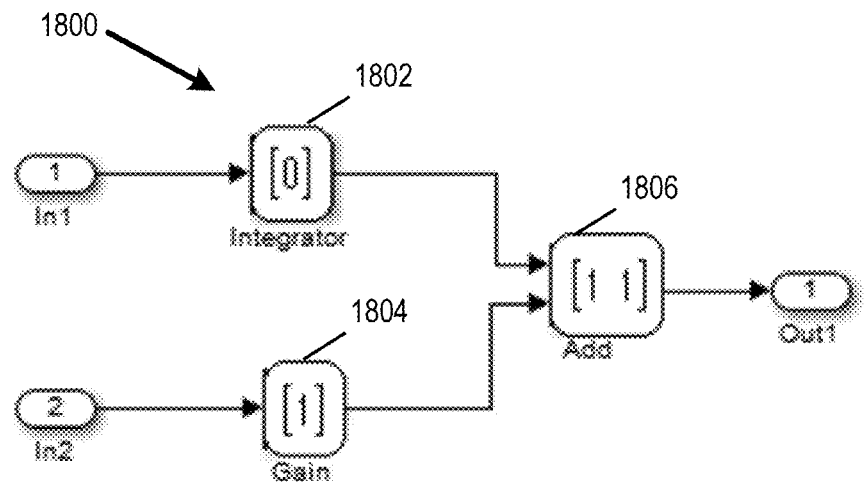
FIG. 18 illustrates a Jacobian pattern view mode of a model according to an illustrative embodiment.

FIG. 18 illustrates a Jacobian pattern view mode of model 1800 according to an illustrative embodiment. As seen in FIG. 18, the icons of Integrator model block 1702, Gain model block 1704, and Add model block 1706 are replaced by respective representations of their Jacobian block pattern matrices $D_p$, namely Integrator 1802, Gain 1804, and Add

17806. In another embodiment, connected model elements may be replaced by their open loop or closed loop pattern Jacobian and/or Jacobian pattern matrices.

A user may also identify certain variables in the block diagram model and the different data dependency paths for the variables may then be highlighted.

Figure 19:
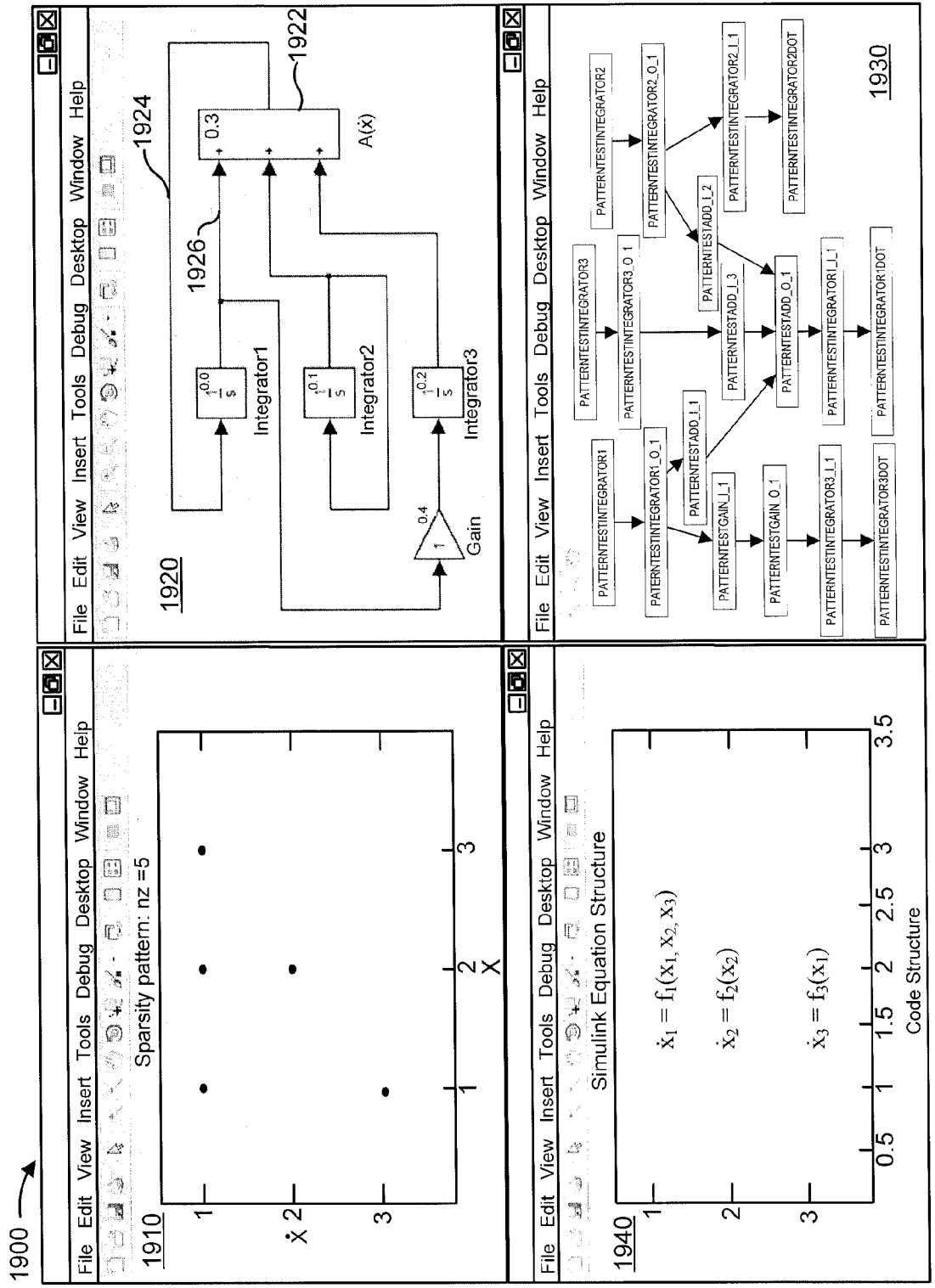
FIG. 19 illustrates an example user interface displaying multiple visualizations according to an illustrative embodiment.

FIG. 19 illustrates an example user interface 1900 displaying multiple visualizations according to an illustrative embodiment. User interface 1900 may include two or more panes. User interface 1900 may be divided into panes 1910, 1920, 1930, and 1940. A pane may represent a quadrant of the user interface 1900.

Pane 1910 may be located in the upper left of the user interface 1900 and may depict a dot Jacobian pattern visualization. Pane 1920 may be located in the upper right of the user interface 1900 and may depict a data dependency path-based representation. In the representation arrows 1924 and 1926 and sum block 1922 may be colored orange and integrator 1928 colored green to indicate dependency between adder 1922 and integrator 1928. Pane 1930 may be located in the lower right of the user interface 1900 and may depict a data dependency diagram. Lastly, pane 1940 may be located in the lower left of the user interface 1900 and may depict symbolic equations.

A user interface containing multiple panes may permit a user to better understand data dependencies in a block diagram model. User interaction between the various panes may be linked. For example, selecting a portion of a visualization in one pane may highlight a corresponding portion of a visualization in another pane. As seen in FIG. 19, pane 1920 and pane 1930 both include corresponding highlights. Pane 1910 and pane 1940 may also be correspondingly highlighted.

Figure 20:
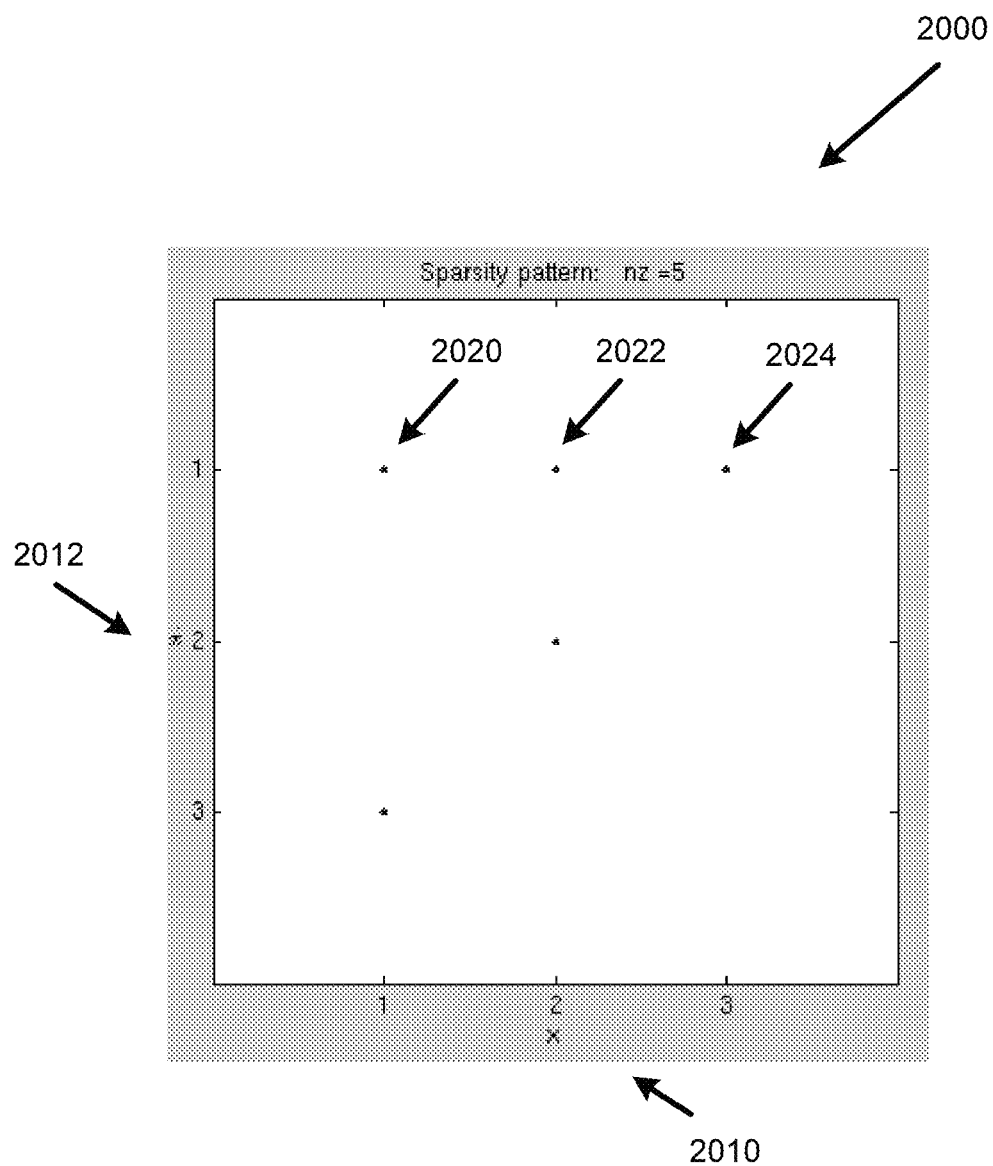
FIG. 20 illustrates an example block dot Jacobian pattern visualization according to an illustrative embodiment.

FIG. 20 illustrates an example dot Jacobian pattern visualization 2000 as may be displayed in pane 1910 according to an illustrative embodiment. Dot pattern visualization 2000 depicts x values on horizontal axis 2010 and $\dot{x}$ values on vertical axis 2012. Dots in dot pattern visualization 2000 may correspond to the presence of a dependency of $\dot{x}$ on x, which may be represented by the value of one in the Jacobian block pattern matrix $A_p$. The display of dot pattern visualization 2000 may allow users to quickly determine dependencies in a block diagram model.

In the illustrative example, dot pattern visualization 2000 represents the closed-loop Jacobian block pattern matrix below:

$$A_p^c = \begin{bmatrix} 1 & 1 & 1 \\ 0 & 1 & 0 \\ 1 & 0 & 0 \end{bmatrix} \quad (22)$$

For example, dots 2020, 2022, and 2024 in the top row corresponding to $\dot{x}_1$ show that $\dot{x}_1$ is dependent on $x_1$, $x_2$, and $x_3$. In an example, if a user hovers a cursor over dot 2024, a tooltip may be displayed stating that $\dot{x}_1$ is dependent on $x_3$.

Dot pattern visualization may also represent non-binary values, for example, the strength of a data dependency. This strength may be based on the numerical value of an entry in the Jacobian matrix. Strength of data dependency may be shown by differing size, color, shape, etc. of the dots and/or other than by dots such as, for example, numerical values. In addition, the visualization may account for the sign of a dependency and whether it includes an imaginary part.

Model aspects may be shown on a Jacobian pattern visualization such as dot pattern visualization 2000. Model aspects may include values of variables. For example, values of variables at a given point in time may be shown in the Jacobian pattern visualization and may provide further information, such as, for example, all blocks in the path from $x_3$ to $\dot{x}_1$. In an embodiment the model aspects may be displayed, for example, in a tooltip that appears when the user hovers a mouse over a dot.

Figure 21:
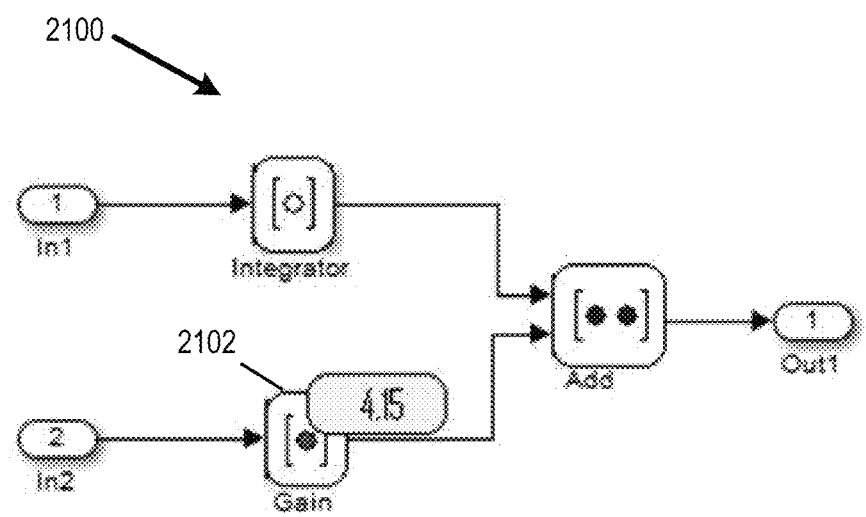
FIG. 21 illustrates a model visualizing model aspects according to an illustrative embodiment.

FIG. 21 illustrates model 2100 visualizing model aspects according to an illustrative embodiment. Model 2100 shows Gain model block 2102 replaced by its Jacobian block pattern matrix $D_p$. If the value K of the gain is time dependent, then the value of the corresponding entry in the Jacobian may change. This value may be shown during execution of model 2100. For example, the value of the entry in the Jacobian block matrix D for Gain model block 2102 is shown as 4.15 in a superimposed field. The visualization may take many forms such as, for example, displaying the matrix values inside block 2102.

Users may also interact with the model through the Jacobian pattern visualization. For example, breakpoints for debugging may be set by interacting with the Jacobian pattern visualization. For example, using model 2100 in FIG. 21, the display of the value 4.15 may be selected and information entered to halt or break execution when the value exceeds 5. For example, the user may type ">5". During further execution when the value of the corresponding entry of the D matrix exceeds 5, the execution may be halted. This information may be visualized. For example, the dot in the dot pattern may take on a different coloring to indicate it is associated with a debug breakpoint. In another example, the user may associate breakpoints with the Jacobian, the Jacobian block matrices A, B, C, D, the Jacobian pattern, the Jacobian block pattern matrices $A_p$, $B_p$, $C_p$, $D_p$, the closed loop Jacobian pattern matrix, the closed loop Jacobian block pattern matrices $A_p^c$, $B_p^c$, $C_p^c$, $D_p^c$, etc.

In another embodiment, model blocks may provide information about their Jacobian, Jacobian pattern, Jacobian block matrices A, B, C, D, etc. as output, for example during execution. Further model blocks may then have this output as input for further computations. The output may be visualized as a port on a block. The block may be depicted differently from other ports to indicate the nature of the information that it provides.

In yet another embodiment models may store information about their Jacobian, Jacobian pattern, Jacobian block matrices A, B, C, D, etc. in a workspace (e.g., a global or a model workspace), for example during execution.

Visualizations may be hierarchical. As an example of hierarchical visualization, dot pattern visualization 2100 may show a Jacobian pattern of a portion of a block diagram model at a certain level of hierarchy in the model. Then, if the user hovers a cursor over an entry, or selects the entry, the Jacobian pattern of the content of the next level in the model hierarchy, or in general the content of a corresponding block, may be shown.

Figure 22:
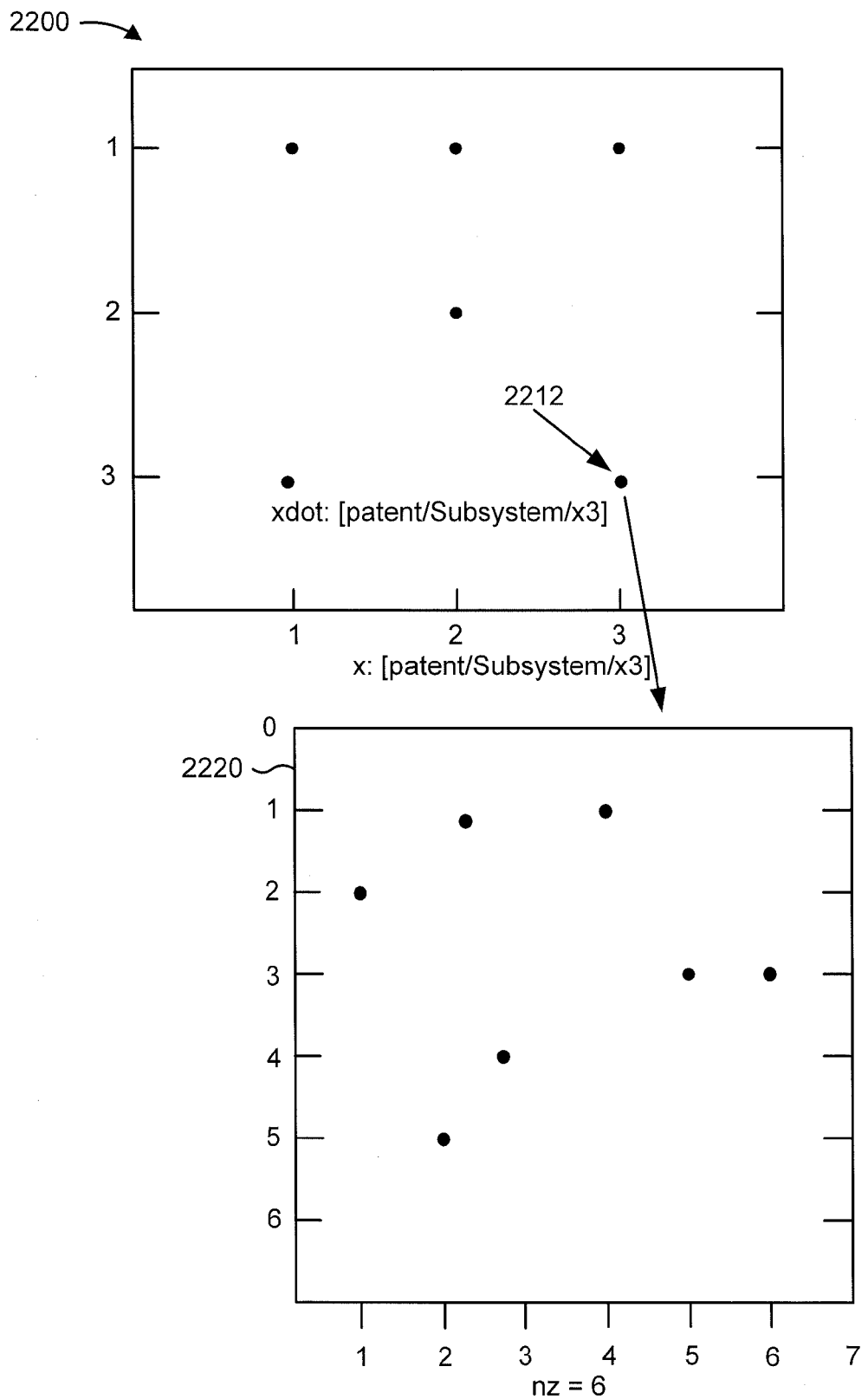
FIG. 22 illustrates a hierarchical visualization of a model in an illustrative embodiment.

FIG. 22 illustrates hierarchical visualization 2200 of model 1200 in an illustrative embodiment. In hierarchical visualization 2200, first level dot pattern visualization 2210 may have a dot indicating dependence between an input and output. If the dot is selected (e.g., clicked, double-clicked, activated, etc.), a second dot pattern visualization 2220 may be displayed which represents a next hierarchical level where the one input and output may be decomposed into variables that they contain. Second dot pattern visualization 2220 may show how those variables are related.

For example, when dot 2212, which is a connection from $\dot{x}_3$ to $x_3$ in the top layer, is clicked, the open loop Jacobian of the subsystem that contains $x_3$ may appear. The open loop Jacobian may contain the [A B C D] matrix of the subsystem.

Figure 23:
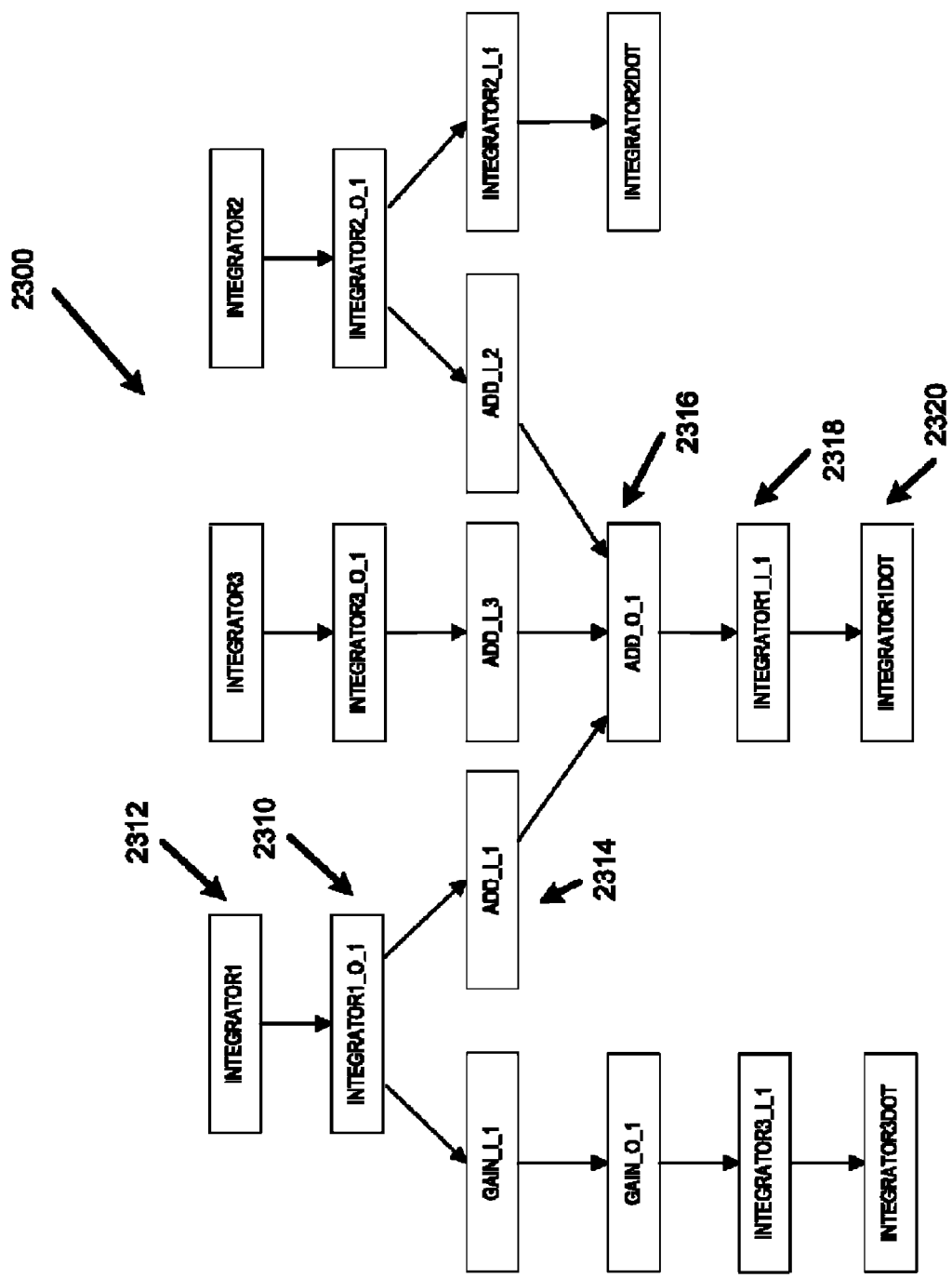
FIG. 23 illustrates an example data dependency diagram visualization according to an illustrative embodiment.

FIG. 23 illustrates example data dependency diagram visualization 2300 that may be displayed in pane 1930 according to an illustrative embodiment. Data dependency diagram visualization 2300 may display a graph view of dependencies in a block diagram model. Nodes in the graph view may correspond to an input, output, derivative, or state in the block diagram model. The nodes may be connected based on the dependencies between the nodes.

Visualization 2300 may also support user interactivity. For example, data dependency in visualization 2300 may be highlighted based on user selections. A user may select a node in visualization 2300. The selected node may then be colored in a first color. Nodes dependent on the selected node may then be colored in a second color. Lastly, any nodes that the selected node is dependent on may be colored in a third color. Other embodiments may use shading, varying line widths, cross-hatching, or other techniques to uniquely identify entities in visualization 2300. In another embodiment, nodes that the selected node depends on may be colored in a fourth color. Nodes that these colored nodes depend on may be colored in a fifth color.

The particular pattern in visualization 2300 may depict dependencies in the block diagram model shown in FIG. 2. The text in the node may describe what the node represents. For example, node 2310 has the text "Integrator1_o_1." Accordingly, node 2310 may represent a first output of the first integrator in the block diagram model. In another embodiment, the node may indicate further information about a corresponding block such as whether it has a hierarchical layer below it, whether it is set to generate a function when code is generated, whether a generated function is set to be reusable, etc.

If node 2312 is selected by a user, node 2312 may be displayed in a graphical manner such as, for example, a specific outline, a specific color, etc. The arrow from node 2312 to node 2310 indicates that the output of integrator1 is dependent on the state of integrator1. Accordingly, node 2310 may, for example, be colored orange to show that node 2310 is dependent on node 2312. The same applies to node 2314, 2316, and 2318. Node 2320 may, for example, be colored green as node 2320 is dependent on selected node 2312.

While coloring is used in data dependency diagram visualization 2300, any other form of highlighting may be used alone or in combination.

Example Processing Technique for Displaying Multiple Visualizations

Figure 24:
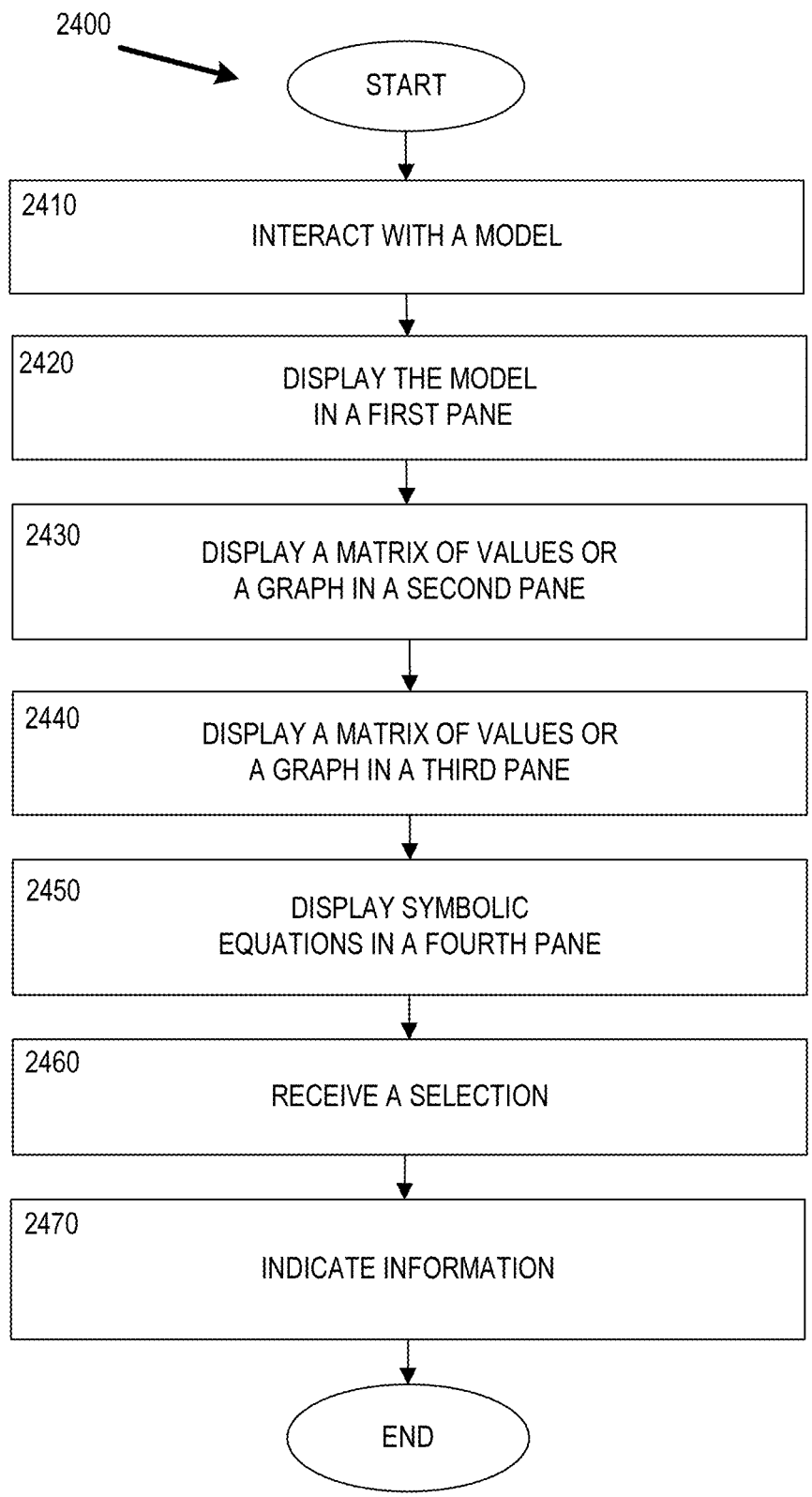
FIG. 24 illustrates exemplary processing for displaying multiple visualizations according to an illustrative embodiment.

FIG. 24 illustrates exemplary processing 2400 for describing a technique for displaying multiple visualizations according to an illustrative embodiment.

The process begins with visualization tool 120 interacting with a model (e.g., a block diagram model or a graphical model) (act 2410). Interacting with the model may include one or more of the steps shown in the example process of FIG. 8.

The model may be displayed in a first pane (act 2420). The model may be displayed by a data dependency path.

A matrix of values indicating relationships between the blocks of the model or a graph indicating the relationships between blocks of the model may then be displayed in a second pane (act 2430). The matrix of values may be displayed by a dot Jacobian pattern visualization 2000. The graph indicating the relationships between blocks of the model may be a data dependency diagram visualization 2300.

A matrix of values indicating relationships between the blocks of the model or a graph indicating the relationships between the blocks of the model may then be displayed in a third pane (act 2440).

Symbolic equations indicating the relationships between the blocks of the model may then be displayed in a fourth pane (act 2450).

A selection indicating a first arbitrary point and a second arbitrary point associated with the model may then be received (act 2460). The first and second points may be arbitrarily chosen by a user. The selection may be received in the first pane or the second pane, for example.

Information associated with the first arbitrary point and the second arbitrary point may then be indicated (act 2470). The indicating may be displayed in the model when the selection is received via the second pane and in the matrix of values or the graph when the selection is received via the first pane, for example.

Selecting a point corresponding to $A_p(1,1)$ in a matrix may result in the indicating (e.g., highlighting) of the path associated with $A_p(1,1)$ in the model. Accordingly, selecting an entry in the matrix view may result in a visualization in the model view.

Alternatively, a selection may occur in any of the four panes 2420, 2430, 2440, 2450, and indicating may occur in any other pane based on the selection. Less than four panes may be displayed. For example, two panes may be displayed pairwise. For example, two of panes 2420, 2430, 2440, and 2450 may be displayed.

Example Distributed System

Figure 25:
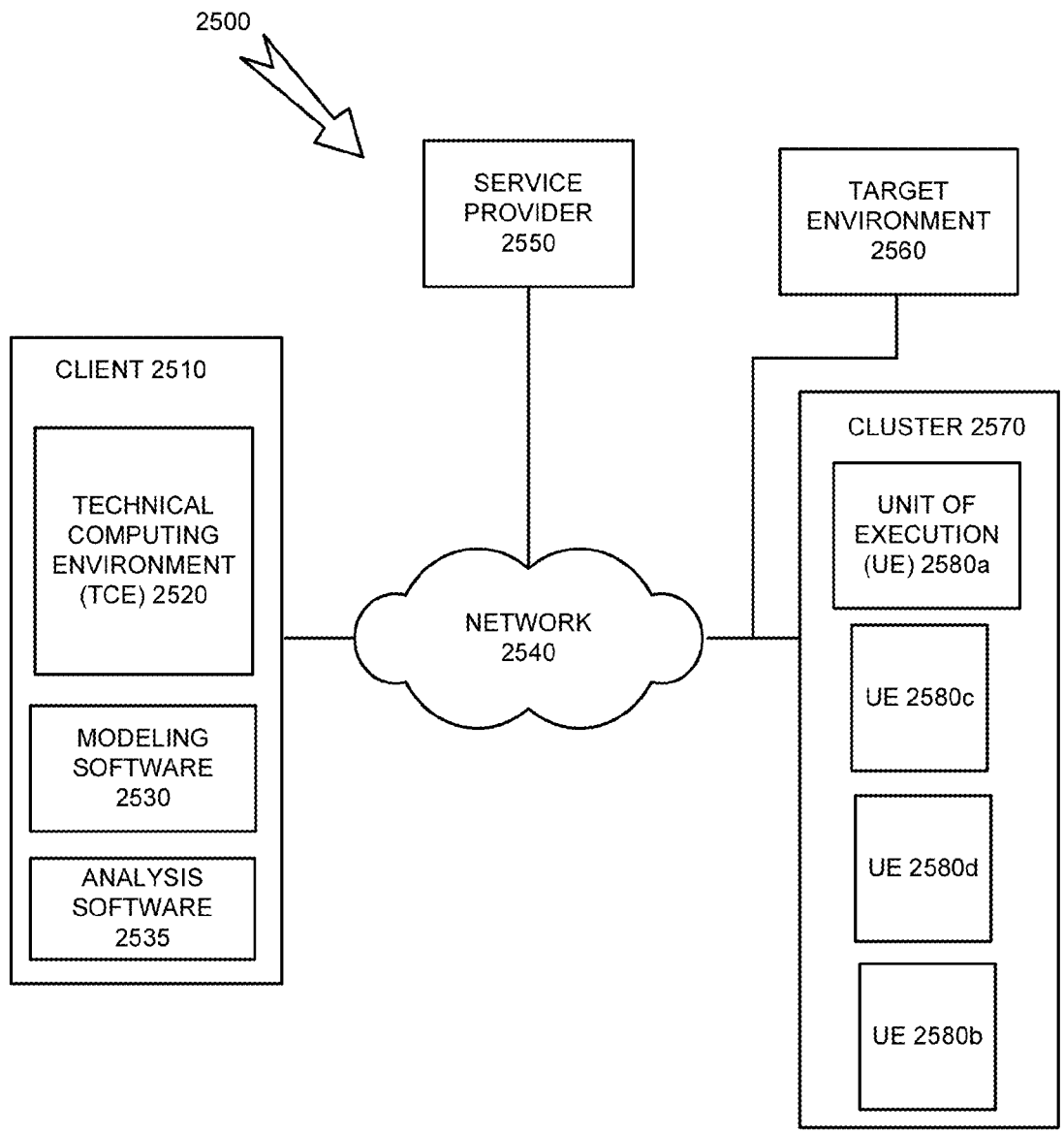
FIG. 25 illustrates a distributed environment that may be configured to practice an illustrative embodiment.

FIG. 25 illustrates distributed environment 2500 that may be configured to practice an illustrative embodiment. Referring to FIG. 25, environment 2500 may include a client 2510, network 2540, service provider 2550, target environment 2560 and cluster 2570. Note that the distributed environment illustrated in FIG. 25 is just one example of a distributed environment that may be used. Other distributed environments may include additional devices, fewer devices, or devices in arrangements that differ from the arrangement of environment 2500. For example, distributed environment 2500 may be implemented as a computing cloud.

Client 2510 may include a device capable of sending and/or receiving information (e.g., data) to and/or from another device, such as target environment 2560. Information may include any type of machine-readable information having substantially any format that may be adapted for use, e.g., in one or more networks and/or with one or more devices. The information may include digital information and/or analog information. The information may further be packetized and/or non-packetized. In an embodiment, client 2510 may download data and/or code via network 2540. For example, client 2510 can download code for suggesting correct identifiers consistent with aspects of the invention.

Client 2510 may be, for example, a desktop computer, a laptop computer, a client computer, a server computer, a mainframe computer, a personal digital assistant (PDA), a web-enabled cellular telephone, a smart phone, smart sensor/actuator, or another computation or communication device that executes instructions that enable the device to perform one or more activities and/or generate one or more results.

In an illustrative embodiment, client 2510 may include a technical computing environment (TCE) 2520, modeling software 2530 and analysis software 2535. TCE 2520 may include a graphical block diagram modeling environment that may be used to design models, execute models, and manipulate the models in accordance with techniques described herein. TCE 2520 may be graphical-based TCE 100. In other illustrative embodiments, client 2510 may include other components, applications, etc. Illustrative embodiments of TCE 2520 may contain computer-executable instructions (e.g., code) and data that are configured to implement the TCE. The instructions may include instructions configured to implement modeling software 2520 and/or graphical analysis software 2535. An example embodiment of graphical-based TCE 100 may be implemented in a TCE 2520.

Modeling software 2530 and analysis software 2535 may be graphical, textual, or a combination that includes both textual and graphical capabilities/features. Modeling software 2530 may include computer-executable instructions that allow, e.g., a user to build and/or execute a model. For example, modeling software 2530 may allow a user to build and execute a time-based model, a state-based model, an event-based model, a dataflow-based model, etc. Modeling software 2350 may include code generation logic which may include hardware and/or software for converting a model into a program or code in a computer programming language (e.g., C, C++, SystemC, etc.). In one example, a code generator may accept a model that is created in the core simulation logic and may generate a hardware description language (HDL). The generated code may be editable using an editor. An execution engine may be configured to compile and link the generated code to produce an "in-memory executable" version of model. The in-memory executable version of the model may be used, for example, to simulate, verify, trim, or linearize the model. An example embodiment of the invention may be implemented as part of modeling software 2530.

Analysis software 2535 may include computer-executable instructions that allow information in a model to be evaluated. Evaluating a model may include generating tests for the model that satisfy model coverage objectives (e.g., condition coverage, decision coverage, modified condition/decision coverage, etc.), user-defined objectives, etc. In addition, evaluating a model may include proving various model properties and generating examples of violations of these properties. Moreover, evaluating a model may include analyzing the model, in accordance with techniques described herein. In an illustrative embodiment, analysis software 2535 may include the Simulink® Design Verifier software which is available from The Math Works, Inc. An example embodiment of the invention may be implemented as part of analysis software 2535. Analysis software 2535 may include software for executing the processes described in the flowcharts of FIGS. 8, 13, and/or 24.

Network 2540 may include any network capable of exchanging information between entities associated with the network, including, for example, client 2510, service provider 2550, target environment 2560 and cluster 2570. Exchanged information may include, for example, packet data and/or non-packet data. Implementations of network 2540 may include local area networks (LANs), metropolitan area networks (MANs), wide-area networks (WANs), etc. Information may be exchanged between entities using any network protocol, such as, but not limited to, the Internet Protocol (IP), Asynchronous Transfer Mode (ATM), Synchronous Optical Network (SONET), the User Datagram Protocol (UDP), Institute of Electrical and Electronics Engineers (IEEE) 802.11, etc.

Network 2540 may include various network devices, such as, for example, routers, switches, firewalls, servers, etc. Portions of network 2540 may be wired (e.g., using wired conductors, optical fibers, etc.) and/or wireless (e.g., free-space optical (FSO), radio frequency (RF), acoustic transmission paths, etc.). Portions of network 2540 may include a substantially open public network, such as the Internet. Portions of network 2540 may include a more restricted network, such as a virtual private network (VPN). It should be noted that implementations of networks and/or devices operating on networks described herein are not limited with regards to information carried by the networks, protocols used in the networks, the architecture/configuration of the networks, etc.

Target environment 2560 may include a device that receives information from client 2510, service provider 2550, or cluster 2570. For example, target environment 2560 may receive executable code from client 2510, where the executable code allows target environment to perform an operation when the code is executed. Client 2510 may have generated the executable code using TCE 2520, modeling software 2530, and/or a code generator (not shown in FIG. 25).

Cluster 2570 may include a number of processing resources that perform processing on behalf of another device, such as client 2510, service provider 2550 and/or target environment 2560. Cluster 2570 may include logic that manages and/or coordinates the operation of multiple processing resources. For example, cluster 2570 may send data to and/or receive results from these processing resources. In an illustrative embodiment, cluster 2570 may include units of execution (UEs) 2580*a, b, c*, and *d* (collectively UEs 2580) that may perform processing on behalf of client 2510 and/or another device, such as service provider 2550. An example embodiment of the invention may be implemented on one or more UEs 2580.

UEs 2580 may include hardware, software, or hybrid logic that performs processing operations on behalf of TCE 2520. For example, in an illustrative embodiment UEs 2580 may parallel process portions of a graphical model created by user of client 2510. This parallel processing may include performing analysis on the model, parsing the model into portions, and/or aggregating results from respective UEs 2580 into a single result for display to a user at client 2510. UEs 2580 may reside on a single device or chip or on multiple devices or chips. For example, UEs 2580 may be implemented in a single application specific integrated circuit (ASIC) or in multiple ASICs. Likewise, UEs 2580 can be implemented in a single computer system using virtualization techniques. Other examples of UEs 2580 may include field programmable gate arrays (FPGAs), complex programmable logic devices (CPLDs), application specific instruction-set processors (ASIPs), microprocessors, etc.

A TCE 2520 may include hardware and/or software based logic that provides a computing environment that allows users to perform tasks related to disciplines, such as, but not limited to, mathematics, science, engineering, medicine, business, etc., more efficiently than if the tasks were performed in another type of computing environment, such as an environment that required the user to develop code in a conventional programming language, such as C++, C, Fortran, Pascal, etc.

Illustrative Computing Architecture Example System

Figure 26:
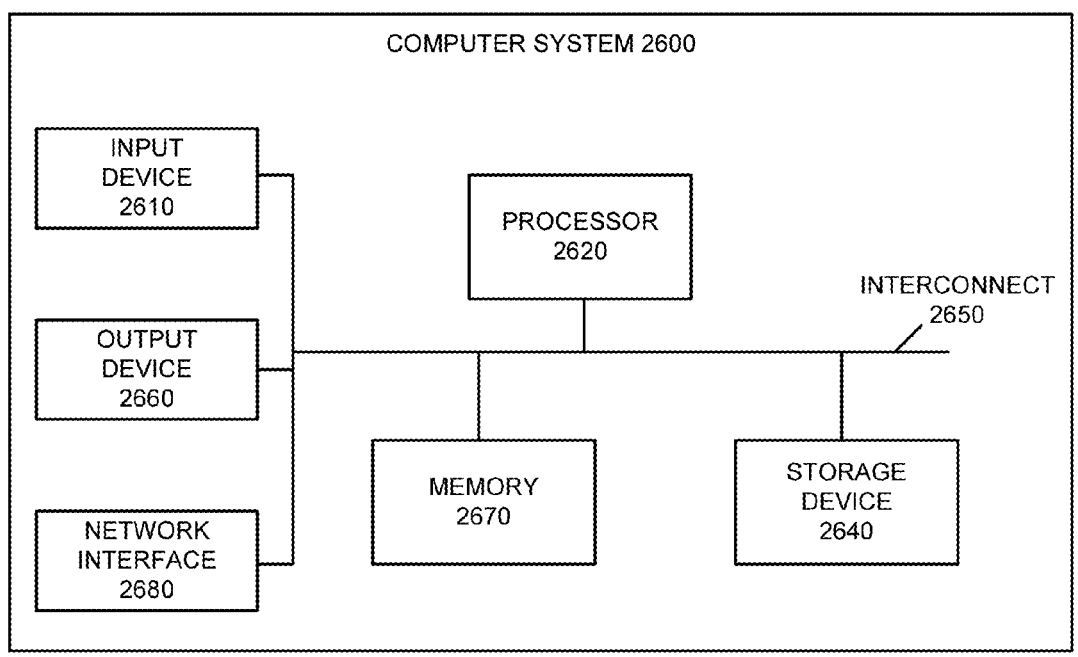
FIG. 26 illustrates an example of a computer system that may be configured to practice an illustrative embodiment.

FIG. 26 illustrates an example of a computer system 2600 that may be configured to practice an illustrative embodiment of the invention. For example, computer system 2600 may be used to implement client 2510, service provider 2550, target environment 2560, etc. Computer system 2600 may include processor 2620, memory 2670, storage device 2640, input device 2610, output device 2660, interconnect 2650 and network interface 2680. Processor 2620 may include logic configured to execute computer-executable instructions that implement illustrative embodiments of the invention. An example of a processor that may be used with the invention includes the Pentium processor available from Intel Corporation, Santa, Clara, Calif. The instructions may reside in memory 2670 and may include instructions associated with TCE 2520 or graphical-based TCE 100.

Memory 2670 may be a computer-readable medium that may be configured to store instructions configured to implement illustrative embodiments of the invention. Memory 2670 may be a primary storage accessible to processor 2620 and can include a random-access memory (RAM) that may include RAM devices, such as, for example, Dynamic RAM (DRAM) devices, flash memory devices, Static RAM (SRAM) devices, etc. Storage device 2640 may include a magnetic disk and/or optical disk and its corresponding drive for storing information and/or instructions.

Interconnect 2650 may include logic that operatively couples components of computer system 2600 together. For example, interconnect 2650 may allow components to communicate with each other, may provide power to components of computer system 2600, etc. In an illustrative embodiment of computer system 2600, interconnect 2650 may be implemented as a bus.

Input device 2610 may include logic configured to receive information for computer system 2600 from, e.g., a user. Illustrative embodiments of input device 2610 may include keyboards, cameras, touch sensitive areas (e.g., displays), multi-point input devices, biometric sensing devices, computer mice, trackpads, trackballs, pen-based point devices, etc. Output device 2660 may include logic configured to output information from computer system 2600. Illustrative embodiments of output device 2660 may include cathode ray tubes (CRTs), plasma displays, light-emitting diode (LED) displays, liquid crystal displays (LCDs), printers, vacuum florescent displays (VFDs), surface-conduction electron-emitter displays (SEDs), field emission displays (FEDs), etc. Interaction for the visualization may be based on receiving input from a user via input device 2610 and providing output to a user via output device 2660.

Network interface 2680 may include logic configured to interface computer system 2600 with a network, e.g., network 2540, and may enable computer system 2600 to exchange information with other entities connected to the network, such as, for example, service provider 2550, target environment 2560 and cluster 2570. Network interface 2680 may be implemented as a built-in network adapter, network interface card (NIC), Personal Computer Memory Card International Association (PCMCIA) network card, card bus network adapter, wireless network adapter, Universal Serial Bus (USB) network adapter, modem or any other device suitable for interfacing computer system 2600 to any type of network.

It should be noted that illustrative embodiments may be implemented using some combination of hardware and/or software. It should be further noted that a computer-readable medium that includes computer-executable instructions for execution in a processor may be configured to store illustrative embodiments of the invention. The computer-readable medium may include volatile memories, non-volatile memories, flash memories, removable discs, non-removable discs and so on. In addition, it should be noted that various electromagnetic signals such as wireless signals, electrical signals carried over a wire, optical signals carried over optical fiber and the like may be encoded to carry computer-executable instructions and/or computer data on e.g., a communication network for an illustrative embodiment of the invention.

A hardware unit of execution may include a device (e.g., a hardware resource) that performs and/or participates in parallel programming activities. For example, a hardware unit of execution may perform and/or participate in parallel programming activities in response to a request and/or a task it has received (e.g., received directly or via a proxy). A hardware unit of execution may perform and/or participate in substantially any type of parallel programming (e.g., task, data, stream processing, etc.) using one or more devices. For example, in one implementation, a hardware unit of execution may include a single processing device that includes multiple cores, and in another implementation, the hardware unit of execution may include a number of processors 2620. A hardware unit of execution may also be a programmable device, such as a field programmable gate array (FPGA), an application specific integrated circuit (ASIC), a digital signal processor (DSP), etc. Devices used in a hardware unit of execution may be arranged in substantially any configuration (or topology), such as a grid, ring, star, etc. A hardware unit of execution may support one or more threads (or processes) when performing processing operations.

A software unit of execution may include a software resource (e.g., a technical computing environment [e.g., MATLAB® software], a worker, a lab, etc.) that performs and/or participates in parallel programming activities. For example, a software unit of execution may perform and/or participate in parallel programming activities in response to receipt of a program and/or one or more portions of the program. In an illustrative embodiment, a software unit of execution may perform and/or participate in substantially any type of parallel programming using one or more hardware units of execution. Illustrative embodiments of a software unit of execution may support one or more threads and/or processes when performing processing operations.

ALTERNATIVE ILLUSTRATIVE EMBODIMENTS

An alternative illustrative embodiment may implement a TCE 2520 using one or more text-based products. For example, a text-based TCE 2520, may be implemented using products such as, but not limited to, MATLAB® programming language by The MathWorks, Inc.; Octave; Python; Comsol Script; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; or Modelica or Dymola from Dassault Systemes.

Other illustrative embodiments may implement a TCE 2520 in a graphically-based TCE 2520 using products such as, but not limited to, Simulink®, Stateflow®, SimEvents™, etc., by The MathWorks, Inc.; VisSim by Visual Solutions; MATRIXx or LabView® by National Instruments; Dymola by Dynasim; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhopsody or Tau from IBM; Ptolemy from the University of California at Berkeley; or aspects of a Unified Modeling Language (UML) or SysML environment.

Another alternative illustrative embodiment may be implemented in a combined TCE 2520 that combines features of a text-based and graphically-based TCE 2520. In one implementation, one TCE 2520 may operate on top of the other TCE 2520. For example, a text-based TCE 2520 (e.g., MAT- LAB®) may operate as a foundation and a graphically-based TCE 2520 (e.g., Simulink®) may operate on top of MATLAB® and may take advantage of text-based features (e.g., commands) to provide a user with a graphical user interface and graphical outputs (e.g., graphical displays for data, dashboards, etc.).

CONCLUSION

Implementations may provide devices and techniques that may be used for the determination of data dependency.

The foregoing description of example embodiments of the invention provides illustration and description, but is not intended to be exhaustive or to limit the invention to the precise form disclosed. Modifications and variations are possible in light of the above teachings or may be acquired from practice of the invention. For example, while a series of acts has been described with regard to FIGS. 8, 13, and 24, the order of the acts may be modified in other implementations consistent with the principles of the invention. Further, non-dependent acts may be performed in parallel.

In addition, implementations consistent with principles of the invention can be implemented using devices and configurations other than those illustrated in the figures and described in the specification without departing from the spirit of the invention. Devices and/or components may be added and/or removed from the implementations of FIGS. 1, 25 and 26 depending on specific deployments and/or applications. Further, disclosed implementations may not be limited to any specific combination of hardware.

Further, certain portions of the invention may be implemented as "logic" that performs one or more functions. This logic may include hardware, such as hardwired logic, an application-specific integrated circuit, a field programmable gate array, a microprocessor, software, wetware, or a combination of hardware and software.

No element, act, or instruction used in the description of the invention should be construed as critical or essential to the invention unless explicitly described as such. Also, as used herein, the article "a" is intended to include one or more items. Where only one item is intended, the term "one" or similar language is used. Further, the phrase "based on," as used herein is intended to mean "based, at least in part, on" unless explicitly stated otherwise.

Headings and/or subheadings used herein are used to segment this patent application into portions to facilitate the readability of the application. These headings and/or subheadings are not intended to define or limit the scope of the invention disclosed and/or claimed in this patent application.

The scope of the invention is defined by the claims and their equivalents.

What is claimed is:

1. One or more non-transitory computer-readable media storing instructions, the instructions comprising:
   one or more instructions that, when executed by one or more processors, cause the one or more processors to:
      receive information identifying a first portion of a block diagram model,
         the block diagram model including a plurality of blocks,
            one or more blocks, of the plurality of blocks, representing one or more dynamic equations,
      determine, for the first portion of the block diagram model, a Jacobian block pattern of relationships between the first portion of the block diagram model and a plurality of:
         an input of a first block of the plurality of blocks,
         an output of the first block,
         a state of the first block, or
         a derivative of the first block;
      determine, based on the Jacobian block pattern of the relationships, a dependency between the first block and the first portion of the model; and
      output information identifying the dependency.

2. The one or more non-transitory computer-readable media of claim 1, where the one or more instructions to determine the Jacobian block pattern of the relationships include:
   one or more instructions that, when executed by the one or more processors, cause the one or more processors to:
      determine another Jacobian block pattern of relationships between two or more of:
         an input of a second block of the plurality of blocks,
         an output of the second block,
         a state of the second block, or
         a derivative of the second block;
      determine relationships representing connections between the first block and the second block in the block diagram model; and
      determine an open loop Jacobian pattern for the first portion of the block diagram model based on the other Jacobian block pattern and the relationships representing the connections between the first block and the second block; and
   where the one or more instructions to determine the dependency include:
      one or more instructions that, when executed by the one or more processors, cause the one or more processors to:
         determine the dependency based on the open loop Jacobian pattern.

3. The one or more non-transitory computer-readable media of claim 2, where the one or more instructions to determine the Jacobian block pattern of the relationships further include:
   one or more instructions that, when executed by the one or more processors, cause the one or more processors to:
      determine a closed loop Jacobian pattern for the first portion of the block diagram model based on the open loop Jacobian pattern.

4. The one or more non-transitory computer-readable media of claim 3, where the instructions further comprise:
   one or more instructions that, when executed by the one or more processors, cause the one or more processors to:
      receive information identifying a second portion of the block diagram model; and
      determine a closed loop Jacobian pattern for the second portion of the block diagram model based on the closed loop Jacobian pattern determined for the first portion of the block diagram model.

5. The one or more non-transitory computer-readable media of claim 1, where the one or more dynamic equations represented by the one or more blocks comprise:
   at least one of a derivative function or an update function; and
   an output function.

6. The one or more non-transitory computer-readable media of claim 1, where the one or more instructions to determine the Jacobian block pattern of the relationships include:
   one or more instructions that, when executed by the one or more processors, cause the one or more processors to:
      determine Jacobian matrices; and determine, based on the Jacobian matrices, the relationships between the first portion of the block diagram model and the plurality of the input, the output, the state, or the derivative.

7. The one or more non-transitory computer-readable media of claim 1, where the one or more instructions to determine the Jacobian block pattern of relationships include:
one or more instructions that, when executed by the one or more processors, cause the one or more processors to determine a Boolean Jacobian pattern of relationships between the first portion of the block diagram model and the plurality of the input, the output, the state, or the derivative.

8. The one or more non-transitory computer-readable media of claim 1, where the Jacobian block pattern of the relationships includes one or more soft zeroes.

9. The non-transitory computer-readable media of claim 1, where the instructions further comprise:
one or more instructions that, when executed by the one or more processors, cause the one or more processors to:
generate a visual representation of the Jacobian block pattern of the relationships,
where the visual representation comprises one or more of a dot Jacobian pattern matrix, a data dependency path, or a data dependency diagram, and
provide the visual representation for display.

10. The one or more non-transitory computer-readable media of claim 1, where the instructions further comprise:
one or more instructions that, when executed by the one or more processors, cause the one or more processors to:
determine a signature of a symbolic equation for the first portion of the block diagram model based on the Jacobian block pattern of the relationships.

11. The one or more non-transitory computer-readable media of claim 10, where the instructions further comprise:
one or more instructions that, when executed by the one or more processors, cause the one or more processors to:
generate a visual representation of the Jacobian block pattern of the relationships,
where the visual representation comprises a portion of the determined symbolic equation; and
provide the visual representation for display.

12. The one or more non-transitory computer-readable media of claim 1, where the instructions further comprise:
one or more instructions that, when executed by the one or more processors, cause the one or more processors to:
cause an execution of the block diagram model; and
update the Jacobian block pattern of the relationships during the execution of the block diagram model.

13. The one or more non-transitory computer-readable media of claim 12, where the instructions further comprise:
one or more instructions that, when executed by the one or more processors, cause the one or more processors to:
interrupt the execution of the block diagram model based on a pre-defined partial Jacobian pattern.

14. The one or more non-transitory computer-readable media of claim 13, where the instructions further comprise:
one or more instructions that, when executed by the one or more processors, cause the one or more processors to:
determine the partial Jacobian pattern based on a user interaction with a Jacobian pattern visualization.

15. One or more non-transitory computer-readable media storing instructions, the instructions comprising:
one or more instructions that, when executed by one or more processors, cause the one or more processors to:
receive a user selection that identifies a first portion of a visual representation of a block diagram model;
determine, using a Jacobian pattern of the block diagram model, a second portion of the block diagram model that is data dependent on the first portion of the block diagram model; and
provide, for display, information identifying the second portion of the block diagram model.

16. The one or more non-transitory computer-readable media of claim 15, where the block diagram model includes connections representing two or more variables, and
where the one or more instructions to provide, for display, the information identifying the second portion of the block diagram model include:
one or more instructions that, when executed by the one or more processors, cause the one or more processors to:
visually distinguish, in a display of the block diagram model, connections, of the connections representing the two or more variables, dependent on a first variable, of the two or more variables, using a first color and connections, of the connections representing the two or more variables, dependent on a second variable, of the two or more variables, using a second color.

17. The one or more non-transitory computer-readable media of claim 16, where the first variable is associated with a computational causality that is different from a computational causality associated with the second variable.

18. The one or more non-transitory computer-readable media of claim 15, where the one or more instructions to provide, for display, the information identifying the second portion of the block diagram model include:
one or more instructions that, when executed by the one or more processors, cause the one or more processors to:
provide, for display, the block diagram model; and
cause the second portion of the block diagram model to be visually distinguished from one or more of the first portion of the block diagram model or a third portion of the block diagram model.

19. The one or more non-transitory computer-readable media of claim 15, where the instructions further comprise:
one or more instructions that, when executed by the one or more processors, cause the one or more processors to:
determine a pattern in the Jacobian pattern; and
provide information identifying a third portion of the block diagram model based on the pattern.

20. The one or more non-transitory computer-readable media of claim 15, where the one or more instructions to receive the user selection include:
one or more instructions that, when executed by the one or more processors, cause the one or more processors to:
receive an identification of one or more variables in the block diagram model; and
where the instructions further comprise:
one or more instructions that, when executed by the one or more processors, cause the one or more processors to:
determine the Jacobian pattern based on the one or more variables.

21. The one or more non-transitory computer-readable media of claim 15, where the instructions further comprise:
one or more instructions that, when executed by the one or more processors, cause the one or more processors to:
provide a visualization of the Jacobian pattern based on a user interaction.

22. A method comprising:
receiving information identifying a first portion of a block diagram model, the block diagram model, when executed, simulating a behavior of a system, the block diagram model including a plurality of blocks,
one or more blocks, of the plurality of blocks, representing one or more dynamic equations, and
receiving the first portion of the block diagram model being performed by a computer;

determining a Jacobian block pattern of relationships between the first portion of the block diagram model and a plurality of:
an input of a first block of the plurality of blocks,
an output of the first block,
a state of the first block, or
a derivative of the first block,
determining the Jacobian block pattern of the relationships being performed by the computer; and providing, based on the Jacobian block pattern of the relationships, information identifying a dependency between the first portion of the block diagram model and the first block.

23. One or more non-transitory computer-readable media storing instructions, the instructions comprising:
one or more instructions that, when executed by one or more processors, cause the one or more processors to:
receive information identifying a first portion of a block diagram model,
the block diagram model including a plurality of blocks,
one or more blocks, of the plurality of blocks, representing one or more dynamic equations;
determine a Jacobian pattern based on a semantic representation of the first portion of the block diagram model;
determine, based on the Jacobian pattern, relationships between the first portion of the block diagram model and a plurality of:
an input of a first block of the plurality of blocks,
an output of the first block,
a state of the first block, or
a derivative of the first block; and
provide information identifying a dependency between the first portion of the block diagram model and the first block based on the relationships.

24. The one or more non-transitory computer-readable media of claim 23, where the first portion of the block diagram model comprises two or more of the plurality of blocks, and
where the two or more of the plurality of blocks are interconnected.

25. The one or more non-transitory computer-readable media of claim 23, where the first portion of the block diagram model comprises the block diagram model.

26. A device comprising:
one or more processors to:
receive information identifying a first portion of a block diagram model,
the block diagram model, when executed, simulating a behavior of a system;
generate a Jacobian pattern of the block diagram model;
determine, based on the Jacobian pattern, a second portion of the block diagram model that is data dependent on the first portion of the block diagram model; and
provide information identifying the second portion of the block diagram model as being data dependent on the first portion of the block diagram model.

27. The device of claim 26, where the one or more processors are further to:
determine, based on the Jacobian pattern, Jacobian matrices; and
where, when determining the second portion of the block diagram model, the one or more processors are to:
determine, based on the Jacobian matrices, the second portion of the block diagram model.

28. The device of claim 26, where the one or more processors are further to:
determine, based on the Jacobian pattern, a signature of a symbolic equation associated with the first portion of the block diagram model; and
where, when determining the second portion of the block diagram model, the one or more processors are to:
determine, based on the signature, the second portion of the block diagram model.

29. A device comprising:
one or more processors to:
receive information identifying a first portion of a block diagram model,
the block diagram model, when executed, simulating a behavior of a system, and
the block diagram model including a plurality of blocks,
one or more blocks, of the plurality of blocks, representing one or more dynamic equations;
determine a Jacobian pattern based on a semantic representation of the first portion of the block diagram model;
determine, based on the Jacobian pattern, relationships between the first portion of the block diagram model and a plurality of:
an input of a first block of the plurality of blocks,
an output of the first block,
a state of the first block, or
a derivative of the first block; and
provide information identifying a dependency between the first portion of the block diagram model and the first block based on the relationships.

30. The device of claim 29, where, when providing the information identifying the dependency, the one or more processors are to:
cause one or more of the first portion of the block diagram model or the first block to be visually distinguished from another portion of the block diagram model in a display of the block diagram model.

31. The device of claim 29, where, when providing the information identifying the dependency, the one or more processors are to:
provide a graphical representation of the Jacobian pattern for display.

32. A device comprising:
one or more processors to:
receive information identifying a first portion of a block diagram model that includes a plurality of blocks,
one or more blocks, of the plurality of blocks, representing one or more dynamic equations;
determine, for the first portion of the block diagram model, a Jacobian block pattern of relationships between the first portion of the block diagram model and a first block of the plurality of blocks;
determine, based on the Jacobian block pattern of the relationships, a dependency between the first block and the first portion of the model; and
output information identifying the dependency.

33. The device of claim 32, where, when determining the Jacobian block pattern of the relationships, the one or more processors are to:
  determine a Jacobian block pattern of relationships between the first portion of the block diagram model and two or more of:
    an input of the first block,
    an output of the first block,
    a state of the first block, or
    a derivative of the first block.

34. The device of claim 32, where, when determining the Jacobian block pattern of the relationships, the one or more processors are to:
  determine a Jacobian block pattern of relationships between the first portion of the block diagram model and two or more of:
    an input of a second block of the plurality of blocks,
    an output of the second block,
    a state of the second block, or
    a derivative of the second block;
  determine relationships representing connections between the first block and the second block; and
  determine an open loop Jacobian pattern for the first portion of the block diagram model based on the Jacobian block pattern of relationship determined for the first block, the Jacobian block pattern of relationships determined for the second block, and the relationships representing connections between the first block and the second block; and
  where, when determining the dependency, the one or more processors are to:
    determine the dependency based on the open loop Jacobian pattern.

35. A method comprising:
  receiving information identifying a first portion of a block diagram model,
    the block diagram model, when executed, simulating a behavior of a system, and
    receiving the information identifying the first portion of the block diagram model being performed by a device;
  determining a Jacobian pattern of the block diagram model,
    determining the Jacobian pattern being performed by the device;
  determining, based on the Jacobian pattern, a second portion of the block diagram model that is data dependent on the first portion of the block diagram model,
    determining the second portion of the block diagram model being performed by the device; and
  providing information identifying the second portion of the block diagram model as being data dependent on the first portion of the block diagram model,
    providing the information identifying the second portion of the block diagram model being performed by the device.

36. The method of claim 35, where determining the Jacobian pattern includes:
  determining a Jacobian block pattern based on the first portion of the block diagram model and two or more of:
    an input of a first block of a plurality of blocks included in the block diagram model,
    an output of the first block,
    a state of the first block, or
    a derivative of the first block.

37. A method comprising:
  receiving information identifying a first portion of a block diagram model,
    receiving the information identifying the first portion being performed by a computing device,
    the block diagram model, when executed, simulating a behavior of a system, and
    the block diagram model including a plurality of blocks, one or more blocks, of the plurality of blocks, representing one or more dynamic equations;
  determining a Jacobian pattern based on a semantic representation of the first portion of the block diagram model,
    determining the Jacobian pattern being performed by the computing device;
  determining, based on the Jacobian pattern, relationships between the first portion of the block diagram model and a plurality of:
    an input of a first block of the plurality of blocks,
    an output of the first block,
    a state of the first block, or
    a derivative of the first block,
      determining the relationships being performed by the computing device; and
  providing information identifying a dependency between the first portion of the block diagram model and the first block based on the relationships,
    providing the information identifying the dependency being performed by the computing device.

38. The method of claim 37, where providing the information identifying the dependency includes:
  causing one or more of the first portion of the block diagram model or the first block to be visually distinguished from another portion of the block diagram model in a display of the block diagram model.

* * * * *